(12) United States Patent
Ohuchi

(10) Patent No.: US 6,590,257 B2
(45) Date of Patent: Jul. 8, 2003

(54) SEMICONDUCTOR DEVICE AND METHOD FOR MANUFACTURING THE SAME, SEMICONDUCTOR WAFER AND SEMICONDUCTOR DEVICE MANUFACTURED THEREBY

(75) Inventor: Shinji Ohuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/888,588

(22) Filed: Jun. 26, 2001

(65) Prior Publication Data

US 2002/0038890 A1 Apr. 4, 2002

(30) Foreign Application Priority Data

Oct. 4, 2000 (JP) ........................ 2000-304720

(51) Int. Cl.[7] .......................... H01L 27/01; H01L 27/12; H01L 31/0392
(52) U.S. Cl. ....................... 257/347; 357/787
(58) Field of Search ................... 257/347, 349, 257/350, 678, 737, 763, 777, 778, 779, 780, 787

(56) References Cited

U.S. PATENT DOCUMENTS 5,343,064 A * 8/1994 Spangler et al. ............ 257/350
6,236,103 B1 * 5/2001 Bernstein et al. ........... 257/532

FOREIGN PATENT DOCUMENTS

JP          11-354631          12/1999

* cited by examiner

Primary Examiner—David Nelms
Assistant Examiner—David Nhu
(74) Attorney, Agent, or Firm—Volentine Francos, PLLC

(57) ABSTRACT

A semiconductor device including a base semiconductor substrate having an edge area which surrounds an element forming area, a buried oxide film provided over the base semiconductor substrate in the element forming area, and an element forming semiconductor substrate provided over the buried oxide film.

16 Claims, 18 Drawing Sheets

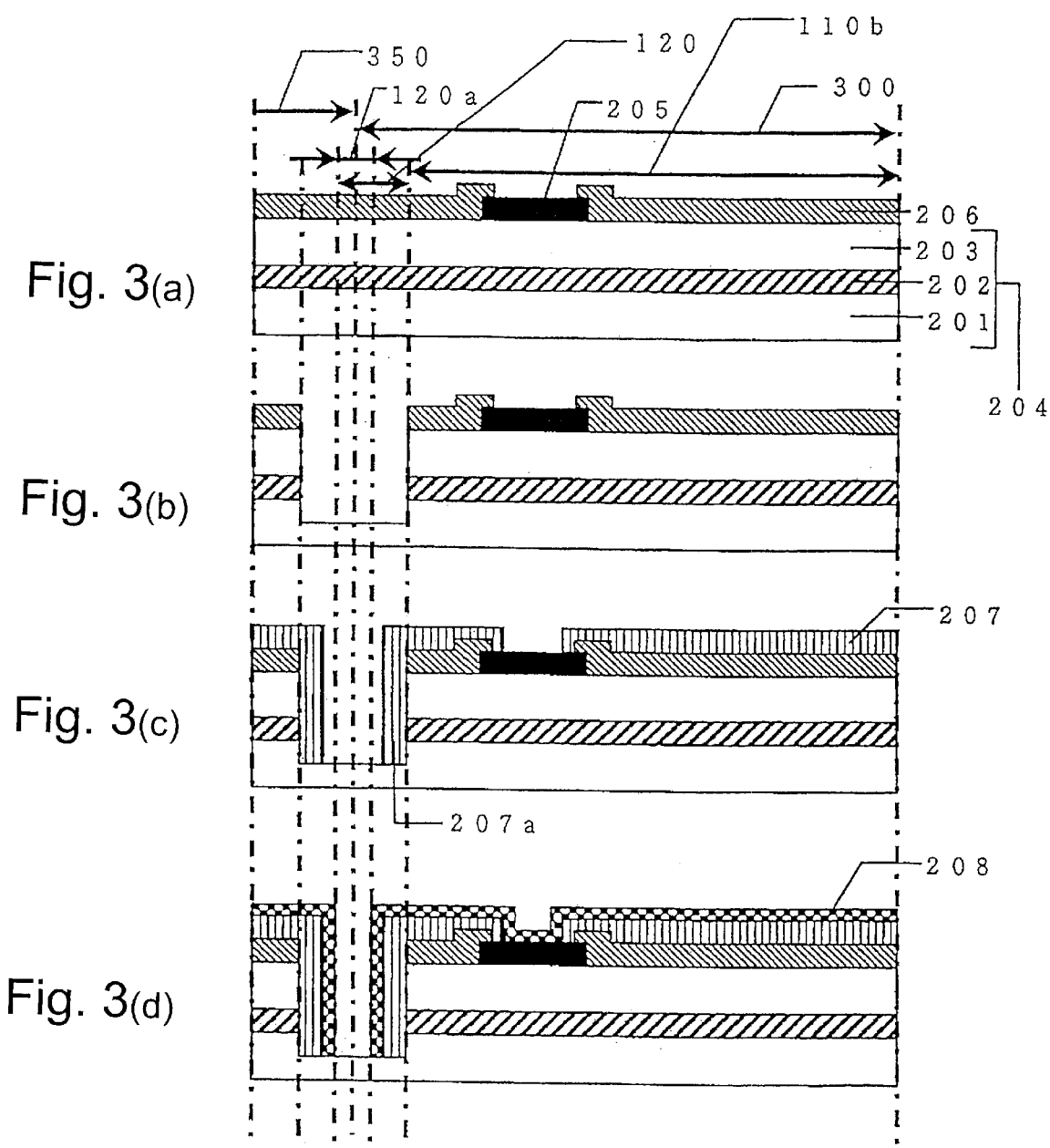

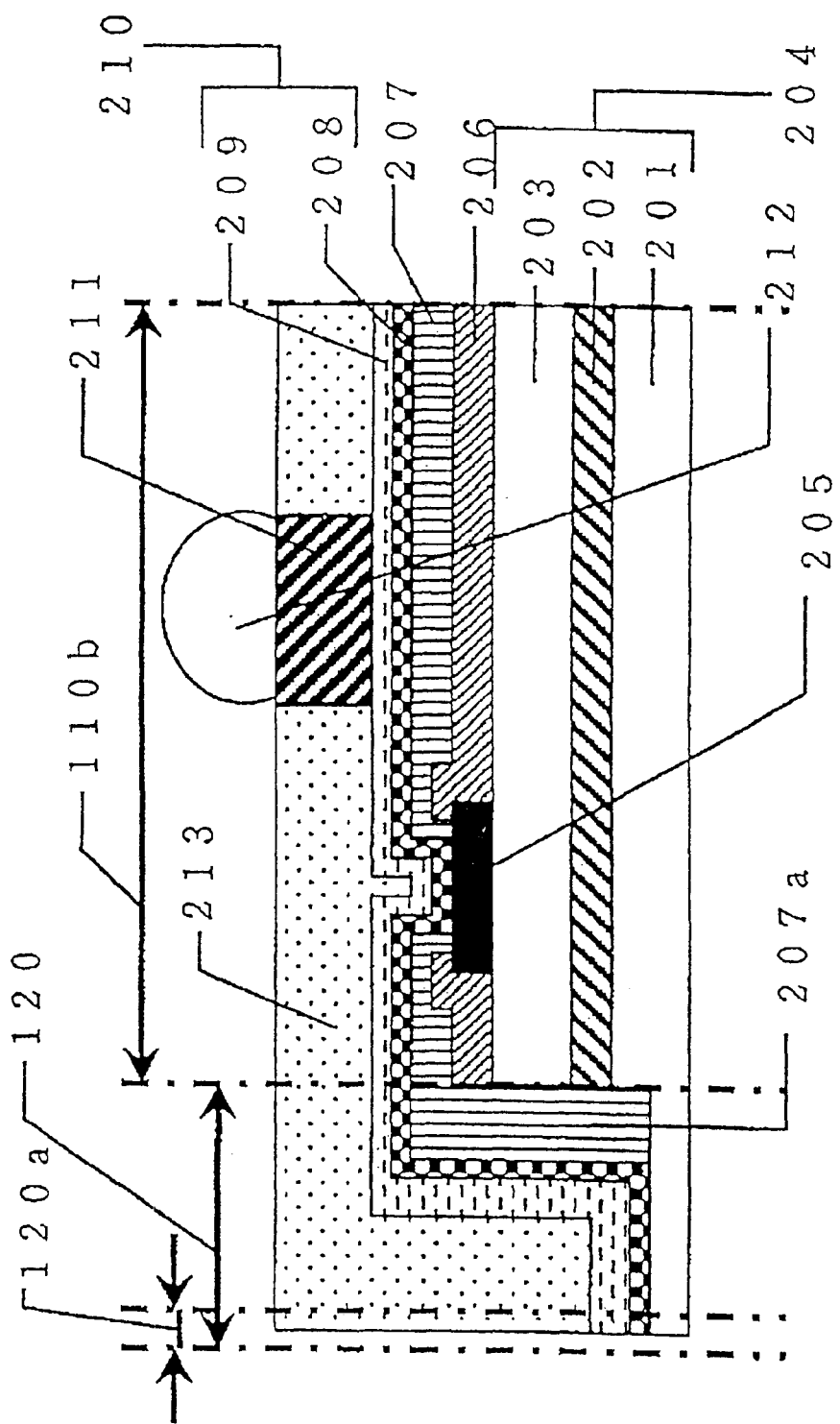

SEMICONDUCTOR DEVICE AND METHOD FOR MANUFACTURING THE SAME, SEMICONDUCTOR WAFER AND SEMICONDUCTOR DEVICE MANUFACTURED THEREBY

BACKGROUND OF THE INVENTION

1. Field of the Invention

The present invention relates to a technology for manufacturing a semiconductor device, and particularly to a semiconductor device having an SOI (Silicon on Insulator) and capable of setting up a back potential thereof, a method of manufacturing the same, and a semiconductor wafer constituted by the semiconductor device.

This application is a counterpart of Japanese Patent Application, Serial Number 304720/2000, filed Oct. 4, 2000, the subject matter of which is incorporated herein by reference.

2. Description of the Related Art

A conventional semiconductor device having an SOI substrate has been described in Japanese Patent Application Laid-Open No. Hei 11-354631. The conventional semiconductor device will be explained with reference to the accompanying drawing.

FIG. 18 is a cross-sectional view showing a configuration of a conventional semiconductor device. The conventional semiconductor device has a semiconductor substrate 1804 in which a semiconductor layer 1803 is provided over a semiconductor support substrate 1801 with a silicon oxide film 1802 interposed therebetween. The semiconductor substrate 1804 has a chip or element forming area 1800 for forming circuits such as transistors, etc., and a substrate potential taking-out area 1820 for fixing a potential for the semiconductor support substrate 1801. Now, an insulation separating layer 1805 is formed between the element forming area 1800 and the substrate potential taking-out area 1820. The element forming area 1800 adjoin the insulation separating layer 1805 and is surrounded by the insulation separating layer 1805. The conventional semiconductor device has a conductive layer 1806 provided within the substrate potential taking-out area 1820, which extends through the silicon oxide film 1802 from the semiconductor layer 1803 so as to reach the semiconductor support substrate 1801. Thus, the conventional semiconductor device serves so as to supply a potential from the semiconductor layer 1803 to the semiconductor support substrate 1801 through an electrode 1807 and the conductive layer 1806. Accordingly, the potential supplied to the semiconductor support substrate 1801 is fixed.

In the conventional semiconductor device, however, the semiconductor layer 1803 exists between the conductive layer 1806 and the insulation separating layer 1805, and the semiconductor layer 1803 exists even between the conductive layer 1806 and an edge portion of the semiconductor device, as shown in FIG. 18. Namely, the conductive layer formed within the substrate potential taking-out area is surrounded by the semiconductor layer in the conventional semiconductor device. Therefore, a problem arises in that the substrate potential taking-out area becomes wide by the width of the semiconductor layer. A semiconductor device called a "wafer level CSP (Wafer Level Chip Size Package)", which has been considered in recent years, must avoid such a problem. This is because the semiconductor device called "the wafer level CSP" is a package having substantially the same width as a chip size and requires the technology of narrowing an area other than the element forming area.

SUMMARY OF THE INVENTION

The present invention aims to provide a semiconductor device capable of setting a substrate potential taking-out area for fixing a potential (back potential) for a semiconductor support substrate thereof, as narrow as possible.

A summary of a typical one of the inventions disclosed in the present application will be explained in brief as follows:

A semiconductor device according to the present invention comprises a semiconductor substrate for a base, which has an element forming area and an edge area for surrounding the element forming area, a buried oxide film provided over a first surface of the base semiconductor substrate in the element forming area, an element forming semiconductor substrate provided over a first surface of the buried oxide film, an insulating film provided over the element forming semiconductor substrate, a third surface of the buried oxide film, and the first surface of the base semiconductor substrate in the edge area, a conductive layer provided over the insulating film and the first surface of the base semiconductor substrate in the edge area, a conductive columnar member provided so as to be electrically connected to the conductive layer, and a sealing member for sealing a third surface of the conductive columnar member and the conductive layer.

According to the above means, a semiconductor device can be provided which is capable of setting a substrate potential taking-out area for forming a conductive layer used to fix a back potential of the semiconductor device, as narrow as possible.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a partially sectional view for describing a process for manufacturing the semiconductor device according to the first embodiment of the present invention;

FIG. 5 is a partially sectional view showing a structure of a semiconductor device according to a second embodiment of the present invention;

DETAILED DESCRIPTION OF THE PREFERRED EMBODIMENTS

Figure 1A:
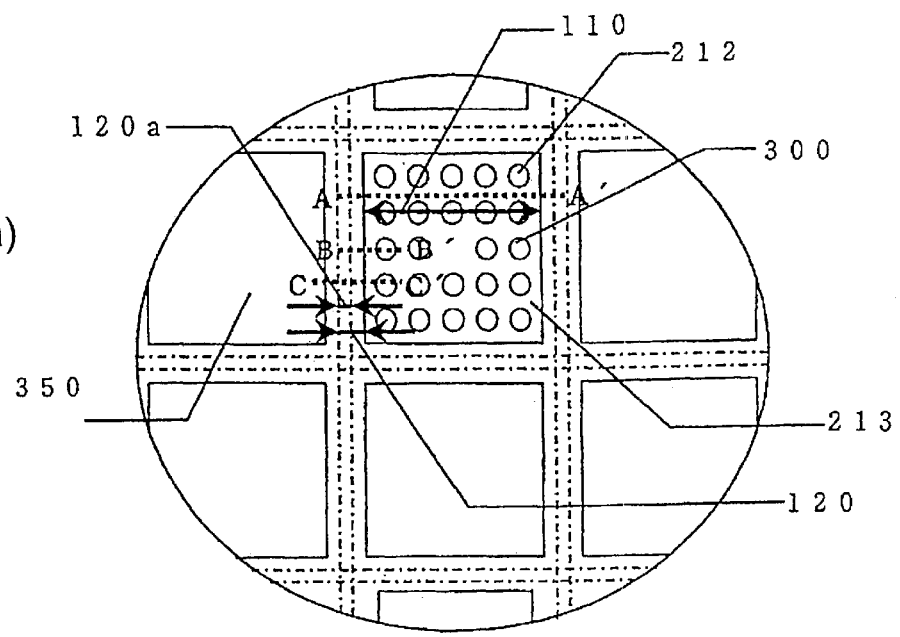
FIG. 1 is a plan view showing the relationship between semiconductor devices according to respective embodiments of the present invention and a wafer, and is a partly cross-sectional view taken along line A–A'.

Preferred embodiments of the present invention will hereinafter be described in detail with reference to the accompanying drawings. In all the drawings for describing the embodiments of the present invention, those each having the same function are identified by the same reference numerals and their repetitive description will therefore be omitted.

Figure 1B:
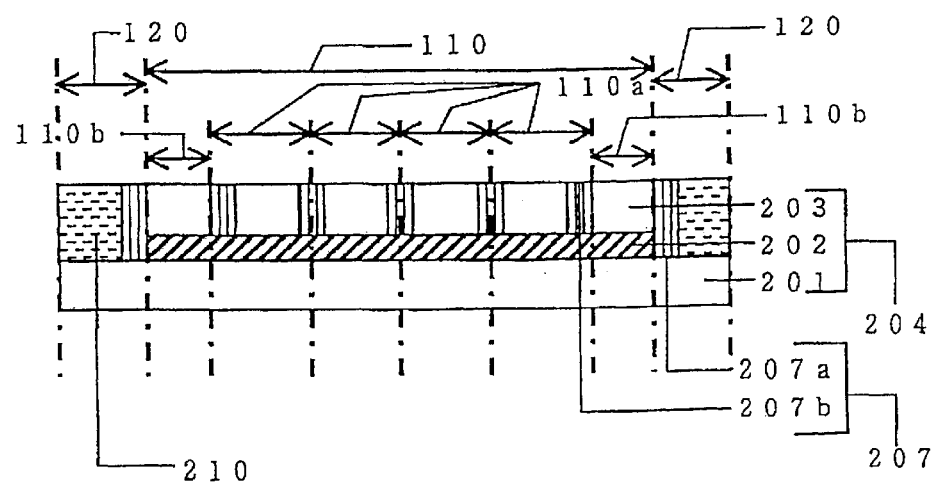

The relationship between semiconductor devices according to respective embodiments of the present invention and a wafer will now be explained with reference to FIG. 1 before the description of the respective embodiments of the present invention. The semiconductor devices according to the respective embodiments of the present invention are respectively manufactured in a wafer state. FIG. 1(a) is a plan view showing the relationship between the semiconductor devices according to the respective embodiments of the present invention and the wafer. FIG. 1(b) is a cross-sectional view taken along line A–A' of FIG. 1(a). Incidentally, an oxide film 206, etc. formed over an element forming semiconductor substrate 203 are omitted from FIG. 1(b) for simplification. The semiconductor device according to each of the embodiments of the present invention comprises an element forming area 110 in which circuit elements such as a transistor, etc. are formed, and an edge area 120 for surrounding the element forming area 110. Further, the wafer comprises a plurality of the semiconductor devices. Each of the semiconductor devices is connected to another semiconductor device through the edge area. Here, a semiconductor substrate 204 in the element forming area 110 has an element forming semiconductor substrate 203 formed over a first surface (e.g., upper surface) of a semiconductor substrate 201 for a base with a buried oxide film 202 interposed therebetween. Namely, the buried oxide film 202 used as an insulative material exists between the element forming semiconductor substrate 203 in the element forming area 110 and the base semiconductor substrate 201. Thus, the semiconductor substrate 204 in the element forming area 110 has an SOI structure. Here, the element forming area 110 is divided into first areas 110a which do not adjoin the edge area 120, and second areas 110b adjacent to the edge area 120. The edge area 120 has a scribe line 120a for separating (scribing) each individual adjacent semiconductor devices from one another. The semiconductor devices according to the respective embodiments of the present invention, which have been fabricated in the wafer state, are diced along the scribe line 120a into individually-divided semiconductor devices having sectional structures shown in FIGS. 2 and 5, FIGS. 7 through 11, and FIGS. 13 through 17. Here, FIGS. 2 and 5, FIGS. 7 through 11 and FIG. 13 are cross-sectional views each taken along line B–B' of FIG. 1(a) illustrative of each individual semiconductor device.

First Preferred Embodiment

Figure 2:
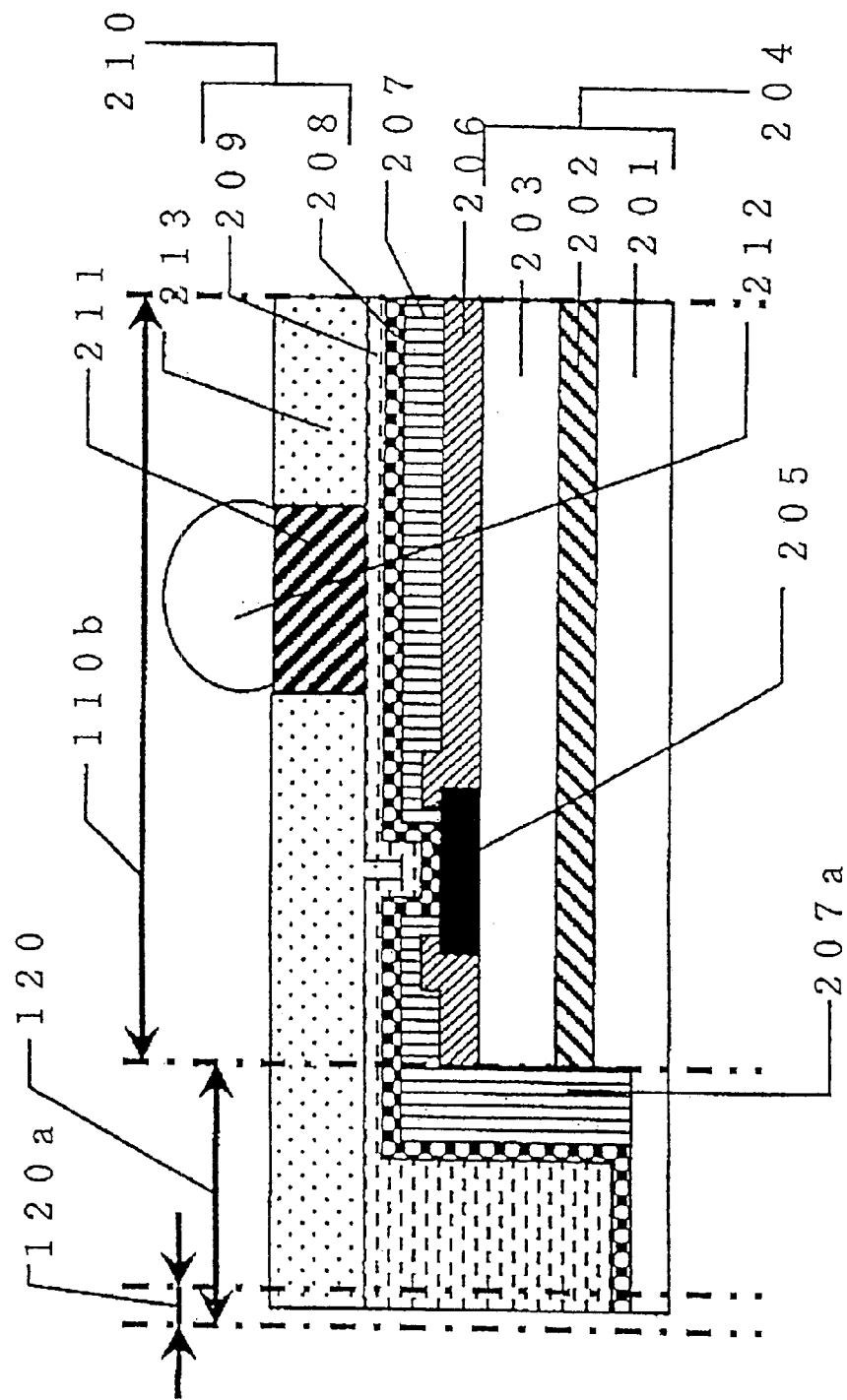
FIG. 2 is a partially sectional view showing a structure of a semiconductor device according to a first embodiment of the present invention.

FIGS. 2 through 4 are respectively diagrams related to a semiconductor device according to a first embodiment of the present invention and a method of manufacturing the same. FIG. 2 shows a structure of the semiconductor device according to the first embodiment of the present invention, and FIGS. 3 and 4 respectively show processes for manufacturing the semiconductor device according to the first embodiment of the present invention.

Incidentally, the respective drawings are respectively partly cross-sectional views of an edge area 120 and a second area 110b of an element forming area 110 employed in the semiconductor device according to the first embodiment of the present invention.

The structure of the semiconductor device according to the first embodiment of the present invention will first be described. As shown in FIG. 2, the semiconductor device according to the first embodiment of the present invention comprises a semiconductor substrate 204, an electrode pad 205 composed of aluminum, for example, an oxide film 206, an insulating film 207 composed of polyimide, for example, a retribute 210 (hereinafter called a "conductive layer 210"), a conductive columnar member 211 (hereinafter called a "post 211") composed of Cu (Copper), for example, a spherical electrode 212 (hereafter called a "solder ball 212") composed of solder, for example, and an encapsulation or sealing member 213 composed of a resin or a metal.

The semiconductor substrate 204 comprises a semiconductor substrate 201 for a base, a buried oxide film 202, and an element forming semiconductor substrate 203. The base semiconductor substrate 201 has the element forming area 110 and the edge area 120. Here, the buried oxide film 202 is provided over a first surface (e.g., upper surface) of the base semiconductor substrate 201 in the element forming area 110. The element forming semiconductor substrate 203 is provided over a first surface (e.g., upper surface) of the buried oxide film 202. Incidentally, no buried oxide film 202 and element forming semiconductor substrate 203 are provided over the first surface of the base semiconductor substrate 201 in the edge area 120.

The electrode pad 205 is provided over the element forming semiconductor substrate 203.

The oxide film 206 is provided over part of a first surface (e.g., upper surface) of the electrode pad 205, a third surface (e.g., each side face) of the electrode pad 205, and the element forming semiconductor substrate 203.

The insulating film 207 is provided over part of the first surface of the electrode pad 205, the oxide film 206, and part of the first surface of the base semiconductor substrate 201 in the edge area 120. Here, an insulating film 207a corresponding to part of the insulating film 207 provided within the edge area 120 is provided in the boundary between the second area 110b and the edge area 120. Further, the insulating film 207a is provided over the first surface of the base semiconductor substrate 201 lying within the second area 110b, a third surface (e.g., side face) of the buried oxide film 202, a third surface (e.g., side face) of the element forming semiconductor substrate 203, and a third surface (e.g., side face) of the oxide film 206.

The conductive layer 210 comprises a metal film 208 (hereinafter called a "Ti metal film 208") composed of Ti(titanium), for example, and a metal film 209 (hereinafter called a "Cu metal film 209") composed of Cu (copper), for example. The Ti metal film 208 is provided over part of the first surface of the electrode pad 205, the insulating films 207 and 207a, and the first surface of the base semiconductor substrate 201 lying within the edge area 120. Here, the Ti metal film 208 is electrically connected to the electrode pad 205. Further, the Ti metal film 208 in the edge area 120 is electrically connected to the base semiconductor substrate 201. The Cu metal film 209 is provided over the Ti metal film 208. The Cu metal film 209 is electrically connected to the Ti metal film 208. Thus, the base semiconductor substrate 201 is electrically connected to the electrode pad 205 through the conductive layer 210. Here, the height extending from the first surface of the base semiconductor substrate 201 in the second area 110b to the Cu metal film 209, and the height extending from the first surface of the base semiconductor substrate 201 in the edge area 120 to the Cu metal film 209 are substantially identical to each other. The reason why the conductive layer 210 comprises the Ti metal film 208 and the Cu metal film 209, is that when the Cu metal film 209 is provided above the insulating film 207, there is a possibility that the Cu metal film 209 will peel. Therefore, the Ti metal film 208 hard to peel as compared with the Cu metal film 209 is provided over the insulating film 207, and the Cu metal film 209 is provided over the Ti metal film 208.

The post 211 is provided over the Cu metal film 209 in the element forming area 110. Here, the post 211 is electrically connected to the Cu metal film 209.

The solder ball 212 is provided over a first surface (e.g., upper surface) of the post 211. The solder ball 212 is electrically connected to the post 211.

The sealing member 213 comprises a resin for sealing or encapsulation, which is made up of an epoxy resin, for example, or a metal good in thermal conduction such as aluminum, nickel, copper, stainless, ceramic or the like. The sealing member 213 seals the Cu metal film 209 in the element forming area 110 and the edge area 120, and a third surface (e.g., side face) of the post 211. Here, the first surface of the post 211 is exposed from the sealing member 213.

As described above, the semiconductor device in the edge area 120 comprises the base semiconductor substrate 201, the conductive layer 210 and the sealing member 213. Further, the conductive layer 210 is provided over the first surface of the base semiconductor substrate 201, and the sealing member 213 is provided over the conductive layer 210.

A method of fixing a potential applied to the base semiconductor substrate 201 by the semiconductor device according to the first embodiment of the present invention will next be described.

The semiconductor device according to the first embodiment of the present invention is electrically connected to another semiconductor device through the solder ball 212 and supplied with a voltage through the solder ball 212. The supplied voltage is supplied to an internal circuit of the semiconductor device according to the first embodiment of the present invention through the post 211, the conductive layer 210 and the electrode pad 205. Further, the supplied voltage is supplied to the base semiconductor substrate 201 through the conductive layer 210. Thus, the potential applied to the base semiconductor substrate 201 is fixed. Here, an internal voltage supplied to a circuit element in the element forming area 110 may be used to fix the potential for the base semiconductor substrate 201. In this case, the internal voltage is supplied to the base semiconductor substrate 201 through the electrode pad 205 and the conductive layer 210.

According to the semiconductor device showing the first embodiment of the present invention, the following advantageous effects are brought about.

(1) The conductive layer 210 for fixing the potential applied to the base semiconductor substrate 201 is formed in the edge area 120 used when the semiconductor devices are scribed. Therefore, the semiconductor device according to the first embodiment of the present invention can form the edge area 120 narrowly and the element forming area 110 widely. Thus, the semiconductor device according to the first embodiment of the present invention can provide the element forming area 110 with a number of circuit elements as compared with the conventional semiconductor device.

(2) No element forming semiconductor substrate 203 exists between the conductive layer 210 in the edge area 120 and the insulating film 207a. Therefore, the semiconductor device according to the first embodiment of the present invention is capable of configuring the edge area 120 narrowly. Thus, the semiconductor device according to the first embodiment of the present invention can be brought into less size as compared with the conventional semiconductor device.

(3) When the present semiconductor device is connected to another semiconductor device through the solder ball 212, it is supplied with the voltage through the solder ball 212. The supplied voltage is supplied to the internal circuit of the semiconductor device according to the first embodiment of the present invention through the electrode pad 205 and supplied to the base semiconductor substrate 201 through the conductive layer 210. Thus, the semiconductor device according to the first embodiment of the present invention is capable of fixing the substrate potential applied to the base semiconductor substrate 201.

(4) The semiconductor device in the edge area 120 comprises the base semiconductor substrate 201, the conductive layer 210 provided over the first surface of the base semiconductor substrate 201, and the sealing member 213 provided over the conductive layer 210. Therefore, the third surface (e.g., side face) of the conductive layer 210 in the edge area 120 is exposed. Thus, when the semiconductor device according to the first embodiment of the present invention is connected to another semiconductor device through the exposed third surface of the conductive layer 210, it is supplied with a voltage from another semiconductor device and is capable of supplying a voltage to another semiconductor device.

A method of manufacturing the semiconductor device according to the first embodiment of the present invention will next be explained. A plurality of the semiconductor devices each according to the first embodiment of the present invention are simultaneously manufactured in a wafer state. FIGS. 3 and 4 are respectively cross-sectional views taken along line C–C' of FIG. 1(a). While two semiconductor devices 300 and 350 are shown for convenience of illustration in FIGS. 3 and 4, it is needless to say that the number of the semiconductor devices is not limited to the two. A process for manufacturing the semiconductor device 300 in a second area 110b of an element forming area 110 and an edge area 120 in particular will be explained below.

As shown in FIG. 3(a), a wafer having a semiconductor substrate 204 provided with an element forming semiconductor substrate 203 over a first surface of a base semiconductor substrate 201 with a buried oxide film 202 interposed therebetween, is first prepared. Here, the semiconductor substrate 204 has the second area 110b of the element forming area 110, and the edge area 120 which surrounds the element forming area 110. An electrode pad 205 is provided over the element forming semiconductor substrate 203 lying within the second area 110b. Further, an oxide film 206 is provided over part of a first surface of the electrode pad 205 and the element forming semiconductor substrate 203.

Next, as shown in FIG. 3(b), a dicing blade is used to cut the oxide film 206, the element forming semiconductor substrate 203, and the buried oxide film 202 toward the base semiconductor substrate 201 as viewed from the oxide film 206 lying within the edge area 120. Further, the base semiconductor substrate 201 is exposed or made bare. Here, the base semiconductor substrate 201 may slightly be cut.

Next, as shown in FIG. 3(c), an insulating film 207 is provided over the oxide film 206 and part of the first surface of the electrode pad 205 by a CVD(Chemical vapor Deposition) method. Simultaneously, an insulating film 207a is provided over part of the first surface of the exposed base semiconductor substrate 201, a third surface of the exposed buried oxide film 202, a third surface of the exposed element forming semiconductor substrate 203, and a third surface of the exposed oxide film 206 by the CVD method. Here, the insulating film 207a is part of the insulating film 207.

Next, as shown in FIG. 3(d), a Ti metal film 208 is provided over the first surface of the electrode pad 205, the insulating film 207, the first surface of the exposed base semiconductor substrate 201, and the insulating film 207a by a sputtering method.

Figure 4A:
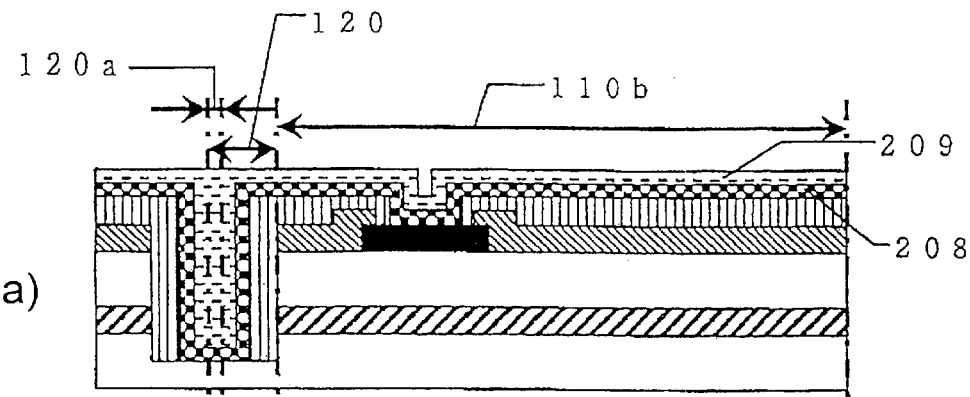
FIG. 4 is a partially sectional view for describing a process for manufacturing the semiconductor device according to the first embodiment of the present invention.

Next, as shown in FIG. 4(a), a Cu metal film 209 is provided over the Ti metal film 208 by the sputtering method. Here, the Cu metal film 209 is provided so as to fill in a trench defined in the semiconductor substrate 204. Namely, the Cu metal film 209 in the element forming area 110 and the edge area 120 becomes substantially horizontal.

Figure 4B:
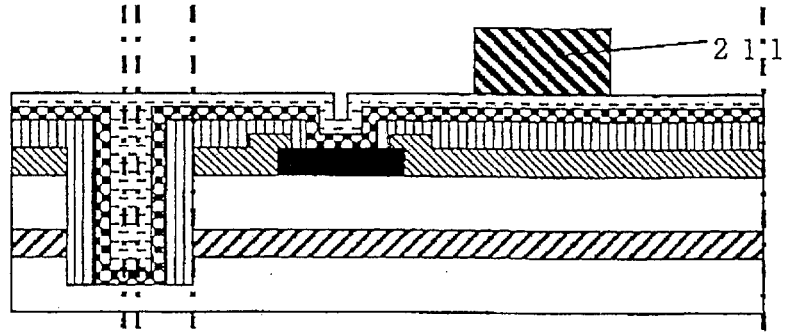

Next, as shown in FIG. 4(b), a post 211 is provided over the Cu metal film 209 in the second area 110b by a photolithography method and a dry etching method. Here, the post 211 is provided so as to be electrically connected to the Cu metal film 209.

Figure 4C:
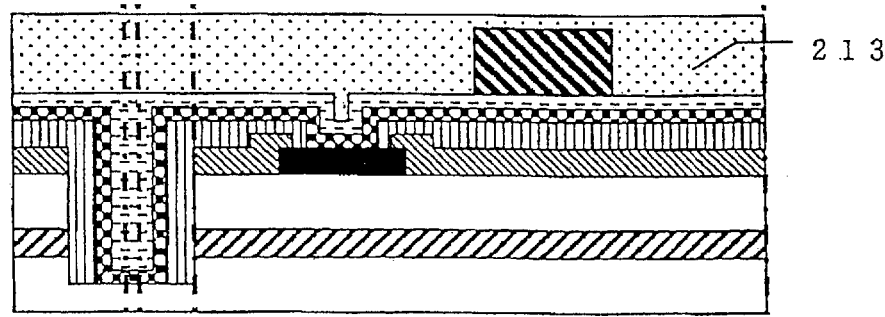

Next, as shown in FIG. 4(c), the Cu metal film 209 and the post 211 are sealed with a sealing member 213. When the sealing member 213 is now of a resin, the whole post 211 is sealed so as to be covered with the sealing member 213 by using a transfer mold method or a potting method or the like. Incidentally, when the sealing member 213 is of a metal, a first surface of the post 211 may be exposed without sealing the entire post 211.

Figure 4D:
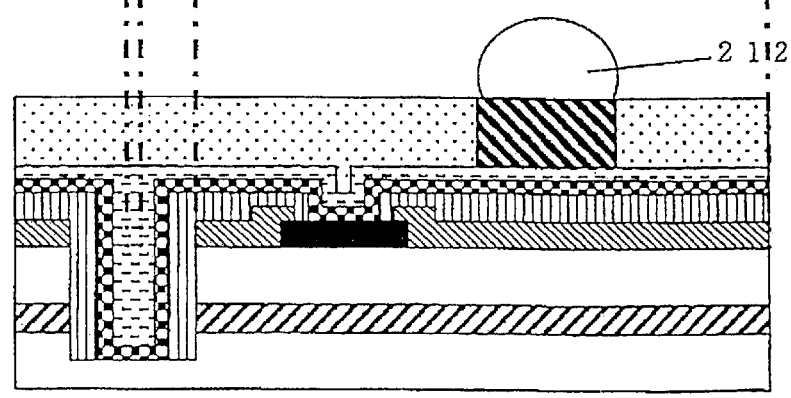

Next, as shown in FIG. 4(d), a solder ball 212 is placed over the exposed first surface of the post 211 by screen printing, solder plating or a super soldering method. Further, the wafer is diced along a scribe line 120a to obtain such a semiconductor device as shown in FIG. 2. When the sealing member 213 is of the resin here, the upper surface of the resin is etched (ground) over its entire surface to thereby expose the first surface of the post 211.

When the insulating film 207a is provided in the process steps shown in FIGS. 3(b) and 3(c) here, an insulating film 207b is provided over the element forming semiconductor substrate 203 in a first area 110a.

According to the method of manufacturing the semiconductor device showing the first embodiment of the present invention, the following advantageous effects are brought about.

(5) In the process step for forming the conductive layer 210 for electrically connecting the electrode pad 205 and the post 211 in the element forming area 110, the conductive layer 210 for fixing the potential applied to the base semiconductor substrate 201 can simultaneously be formed in the edge area 120. In addition, the insulating film 207a can simultaneously be provided in the edge area 120 in the process step for providing the insulating film 207b over the element forming semiconductor substrate 203 in the first area 110a. It is thus unnecessary to provide an additional process step for the provision of the conductive layer 210 and the insulating film 207a in the edge area 120. Therefore, the method of manufacturing the semiconductor device according to the first embodiment of the present invention is good in working efficiency as compared with the conventional semiconductor device manufacturing method.

(6) The plurality of semiconductor devices manufactured in the wafer state are connected to one another through each individual edge areas 120. The conductive layer 210 is formed in each of the edge areas 120 between the plurality of semiconductor devices to fix the potential applied to the base semiconductor substrate 201. Thus, the conductive layers 210 for all the adjacent semiconductor devices can simultaneously be provided in one process. Therefore, the method of manufacturing the semiconductor device according to the first embodiment of the present invention is good in working efficiency as compared with the conventional semiconductor device manufacturing method.

Second Preferred Embodiment

Figure 6:
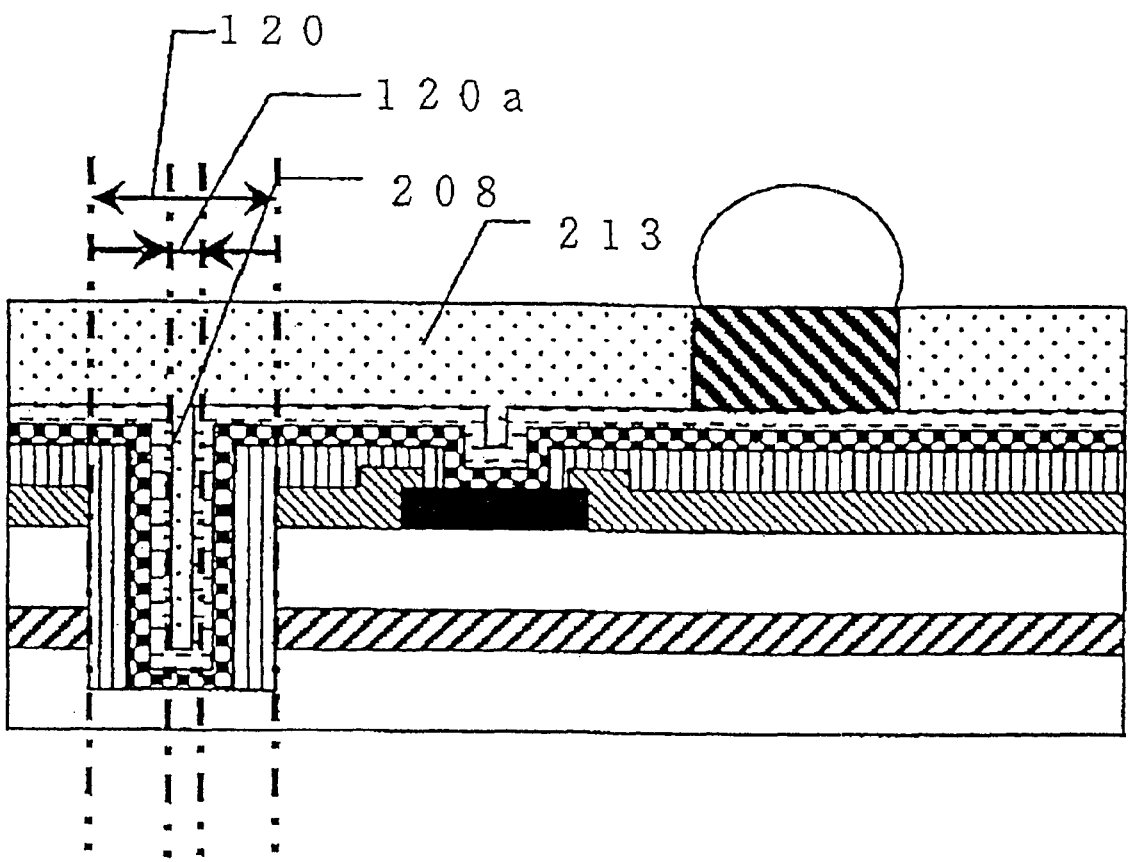
FIG. 6 is a partially sectional view for describing a process for manufacturing the semiconductor device according to the second embodiment of the present invention.

FIGS. 5 and 6 are respectively diagrams related to a semiconductor device according to a second embodiment of the present invention and a method of manufacturing the same. FIG. 5 shows a structure of the semiconductor device according to the second embodiment of the present invention, and FIG. 6 shows a process for manufacturing the semiconductor device according to the second embodiment of the present invention. Incidentally, the respective drawings are respectively partly cross-sectional views of an edge area 120 and a second area 110b of an element forming area 110 employed in the semiconductor device according to the second embodiment of the present invention.

The structure of the semiconductor device according to the second embodiment of the present invention will first be described. In the semiconductor device according to the second embodiment of the present invention, the thickness of a sealing member 213 in the edge area 120 is set so as to be thicker than that of the sealing member 213 in the second area 110b as shown in FIG. 5. Thus, the area at which the sealing member 213 and a conductive layer 210 in the edge area 120 are brought into contact with each other, becomes wide. Further, the exposed area of the sealing member 213 becomes wide as viewed from the side face of the semiconductor device in the edge area 120. Thus, the exposed area of the conductive layer 210 in the edge area 120 becomes narrow.

According to the semiconductor device showing the second embodiment of the present invention, the following advantageous effects are brought about in addition to the advantageous effects (1) through (4) obtained in the semiconductor device according to the first embodiment of the present invention.

(7) The area at which the sealing member 213 and the conductive layer 210 in the edge area 120 are brought into contact with each other, is wide, and an anchor effect is enhanced. Thus, the semiconductor device according to the second embodiment of the present invention makes it hard to peel the conductive layer 210 in the edge area 120 and the sealing member 213 in the edge area 120 from each other.

(8) The exposed area of the conductive layer 210 in the edge area 120 is narrow. Thus, the semiconductor device according to the second embodiment of the present invention is capable of narrowing the area of the conductive layer 210 open to the outside air and preventing the conductive layer 210 from eroding.

A method of manufacturing the semiconductor device according to the second embodiment of the present invention will next be described. In the method of manufacturing the semiconductor device according to the second embodiment of the present invention, the process step of FIG. 4 for providing the Cu metal film 209 is changed and a process step shown in FIG. 6 is carried out in place of the process step shown in FIG. 4(c). In the process step shown in FIG. 4(a), the Cu metal film 209 is set non-thick. Namely, the Cu metal film 209 is not provided so as to fill in a trench defined in the semiconductor substrate 204 in the edge area 120. As shown in FIG. 6, the sealing member 213 is provided so as to bury the trench defined in the semiconductor substrate 204.

According to the method of manufacturing the semiconductor device showing the second embodiment of the present invention, the following advantageous effects are brought about in addition to the advantageous effects (5) and (6) obtained in the method of manufacturing the semiconductor device according to the first embodiment of the present invention.

(9) When it is desired to scribe a semiconductor wafer along a scribe line 120a, the sealing member 213 is cut in excess and the conductive layer 210 is cut only slightly. Thus, the method of manufacturing the semiconductor device according to the second embodiment of the present invention is capable of scribing the semiconductor wafer without damage to the conductive layer 210.

Third Preferred Embodiment

Figure 7:
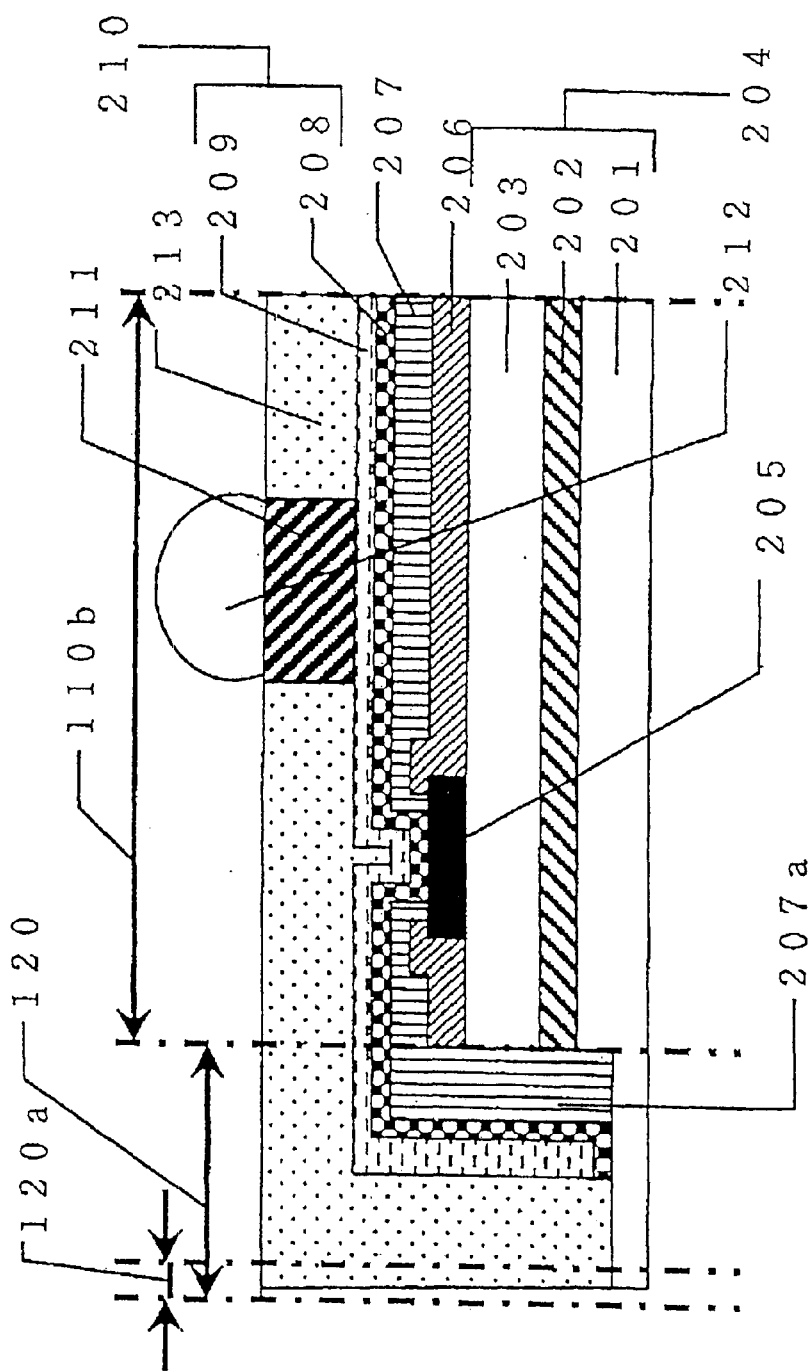
FIG. 7 is a partially sectional view illustrating a structure of a semiconductor device according to a third embodiment of the present invention.

FIG. 7 is a diagram related to a semiconductor device according to a third embodiment of the present invention. FIG. 7 shows a structure of the semiconductor device according to the third embodiment of the present invention. Incidentally, FIG. 7 shows partly cross-sectional views of an edge area 120 and a second area 110b of an element forming area 110 employed in the semiconductor device according to the third embodiment of the present invention.

In the semiconductor device according to the third embodiment of the present invention, a sealing member 213 in the edge area 120 is provided even over a first surface of a semiconductor substrate 201 for a base. Thus, the area at which the sealing member 213 and a conductive layer 210 in the edge area 120 are brought into contact with each other, becomes wide. Namely, the sealing member 213 and the base semiconductor substrate 201 are exposed, whereas the conductive layer 210 is not exposed, at an edge portion of the semiconductor device according to the third embodiment of the present invention.

According to the semiconductor device showing the third embodiment of the present invention, the following advantageous effects are brought about in addition to the advantageous effects (1) through (4) obtained in the semiconductor device according to the first embodiment of the present invention.

(10) Since the sealing member 213 in the edge area 120 widely takes the area for contact with the conductive layer 210 in the edge area 120, and is provided over the first surface of the base semiconductor substrate 201 in the edge area 120, an anchor effect is enhanced. Thus, the semiconductor device according to the third embodiment of the present invention makes it hard to peel the sealing member 213 in the edge area 120.

(11) Since the conductive layer 210 in the edge area 120 is not open to the outside air, it has little occasion to make contact with moisture. Thus, the semiconductor device according to the third embodiment of the present invention is capable of preventing the conductive layer 210 from eroding.

Fourth Preferred Embodiment

FIG. 8 is a diagram related to a semiconductor device according to a fourth embodiment of the present invention. FIG. 8 shows a structure of the semiconductor device according to the fourth embodiment of the present invention. Incidentally, FIG. 8 shows partly cross-sectional views of an edge area 120 and a second area 110b in an element forming area 110 employed in the semiconductor device according to the fourth embodiment of the present invention.

As shown in FIG. 8, the semiconductor device according to the fourth embodiment of the present invention has a second retribute 801 (hereinafter called a "second conductive layer 801"), a second conductive columnar member 805 (hereinafter called a "second post 805") composed of Cu (copper), for example, and a second spherical electrode 806 (hereinafter called a "solder ball 806") composed of solder, for example.

The second conductive layer 801 comprises a metal film 802 (hereinafter called a "second Ti metal film 802") composed of Ti, for example, and a metal film 803 (hereinafter called a "second Cu metal film 803") composed of Cu (copper), for example. The second Ti metal film 802 is provided over an insulating film 207 in the second area 110b, a first surface of a base semiconductor substrate 201 in the edge area 120, and an insulating film 207a in the edge area 120. Here, the second Ti metal film 802 in the edge area 120 is electrically connected to the base semiconductor substrate 201. The second Cu metal film 803 is provided over the second Ti metal film 802. The second Cu metal film 803 is electrically connected to the second Ti metal film 802. Incidentally, a conductive layer 210 (also called a "first conductive layer") and the second conductive layer 801 are provided so as to be electrically disconnected from each other. Here, the height extending from the first surface of the base semiconductor substrate 201 in the second area 110b to a Cu metal film 209, and the height extending from the first surface of the base semiconductor substrate 201 in the edge area 120 to the second Cu metal film 803 are substantially identical to each other. The reason why the second conductive layer 801 comprises the second Ti metal film 802 and the second Cu metal film 803, is that when the second Cu metal film 803 is provided above the insulating film 207, there is a possibility that the second Cu metal film 803 will peel. Therefore, the second Ti metal film 802 hard to peel as compared with the second Cu metal film 803 is provided over the insulating film 207, and the second Cu metal film 803 is provided over the second Ti metal film 802.

The second post 805 is provided over the second Cu metal film 803 in the second area 110b. Here, the second post 805 is electrically connected to the second Cu metal film 803.

The second solder ball 806 is provided over a first surface of the second post 805. The second solder ball 806 is electrically connected to the second post 805.

A sealing member 213 is provided so as to electrically disconnect the conductive layer 210 electrically connected to an electrode pad 205 from the second conductive layer 801.

Here, a post 211 provided over the conductive layer 210 is defined as a first conductive columnar member, and a solder ball 212 provided over a first surface of the post 211 is defined as a second spherical electrode.

A method of fixing a potential applied to the base semiconductor substrate 201 by the semiconductor device according to the fourth embodiment of the present invention will next be described.

The semiconductor device according to the fourth embodiment of the present invention is electrically connected to another semiconductor device through the second solder ball 806 and supplied with a voltage through the second solder ball 806. The supplied voltage is supplied to the base semiconductor substrate 201 through the second post 805 and the second conductive layer 801. Thus, the potential applied to the base semiconductor substrate 201 is fixed. Here, the voltage supplied through the solder ball 212 is supplied to each circuit element through the conductive layer 210 and the electrode pad 205 without being supplied to the base semiconductor substrate 201.

According to the semiconductor device showing the fourth embodiment of the present invention, the following advantageous effects are brought about in addition to the advantageous effects (1) and (2), and (4) obtained in the semiconductor device according to the first embodiment of the present invention.

(12) The second conductive layer 801 for fixing the potential for the base semiconductor substrate 201, and the conductive layer 210 electrically connected to each circuit element provided on an element forming semiconductor substrate 203 are electrically disconnected from each other. Therefore, the base semiconductor substrate 201 is capable of obtaining a potential through the second solder ball 806 regardless of each circuit element provided on the element forming semiconductor substrate 203. Thus, the semiconductor device according to the fourth embodiment of the present invention is capable of preventing an influence from being exerted on the circuit elements such as a transistor, etc. provided on the element forming semiconductor substrate 203.

Figure 8A:
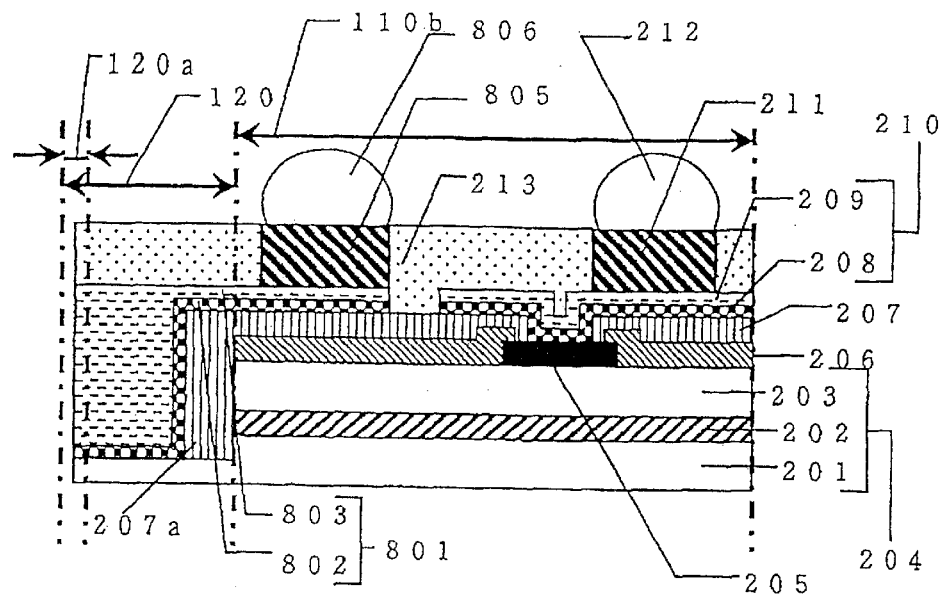
FIG. 8 is a partially sectional view depicting a structure of a semiconductor device according to a fourth embodiment of the present invention.
Figure 8B:
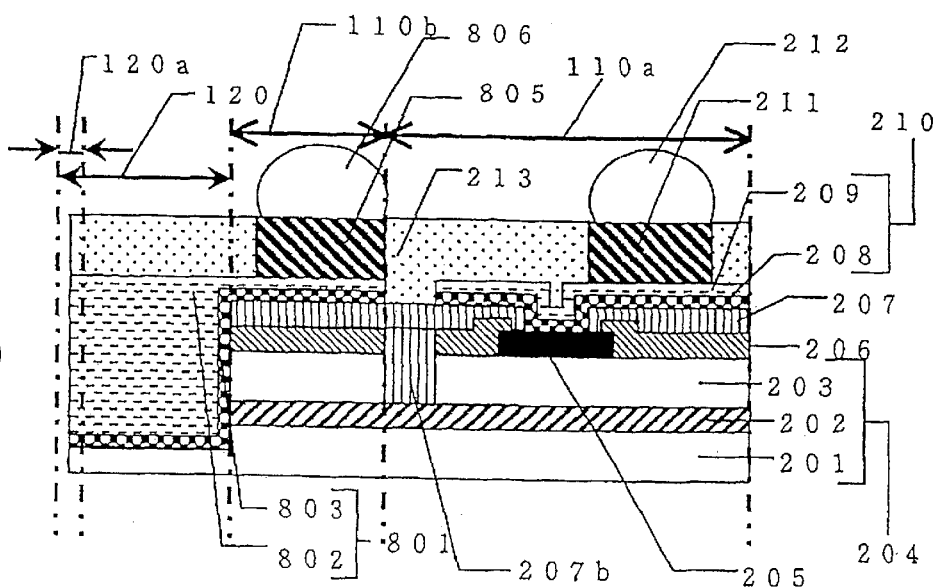

Incidentally, an insulating film 207b may be provided in the boundary between an element forming semiconductor substrate 203 in a first area 110a of an element forming area 110 and the element forming semiconductor substrate 203 in a second area 110b as shown in FIG. 8(b). Owing to its provision, the insulating film 207a in the edge area 120 can be cut or removed. Thus, the edge area 120 shown in FIG. 8(b) can be formed so as to be considerably narrower than the edge area 120 shown in FIG. 8(a).

Fifth Preferred Embodiment

FIG. 9 is a diagram related to a semiconductor device according to a fifth embodiment of the present invention. FIG. 9 shows a structure of the semiconductor device according to the fifth embodiment of the present invention. Incidentally, FIG. 9 shows partly cross-sectional views of an edge area 120 and a second area 110b in an element forming area 110 employed in the semiconductor device according to the fifth embodiment of the present invention.

In the semiconductor device according to the fifth embodiment of the present invention, the thickness of a sealing member 213 in the edge area 120 is set so as to be thicker than that of the sealing member 213 in the second area 110b as shown in FIG. 9. Thus, the area at which the sealing member 213 and a second conductive layer 801 in the edge area 120 are brought into contact with each other, becomes wide. Further, the exposed area of the sealing member 213 becomes wide as viewed from the side face of the semiconductor device in the edge area 120. Thus, the exposed area of the second conductive layer 801 in the edge area 120 becomes narrow.

According to the semiconductor device showing the fifth embodiment of the present invention, the advantageous effects (1), (2) and (4), (7) and (8), and (12) respectively obtained in the semiconductor devices according to the first, second and fourth embodiments of the present invention are brought about.

Figure 9A:
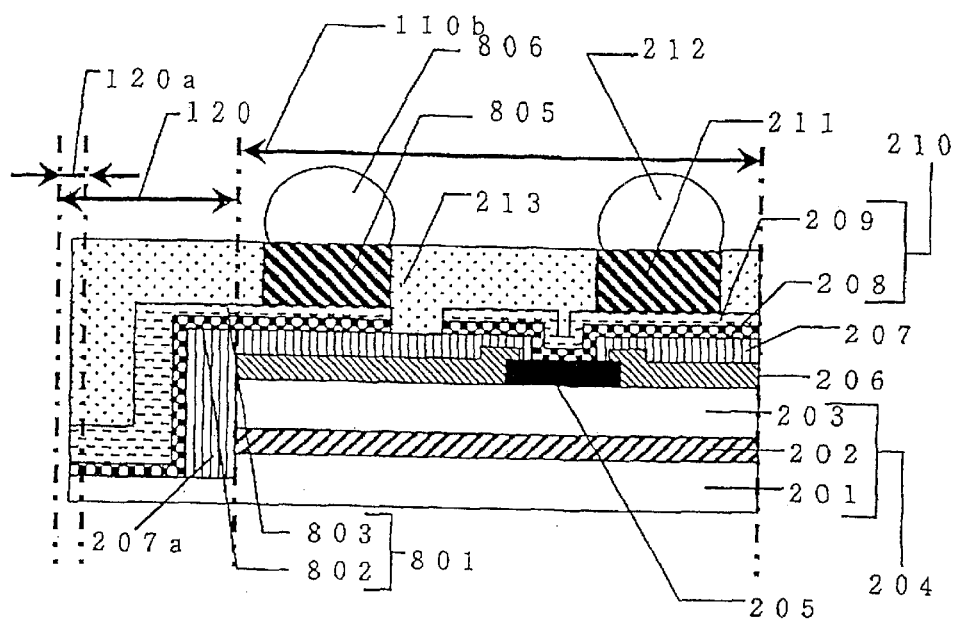
FIG. 9 is a partially sectional view showing a structure of a semiconductor device according to a fifth embodiment of the present invention.
Figure 9B:
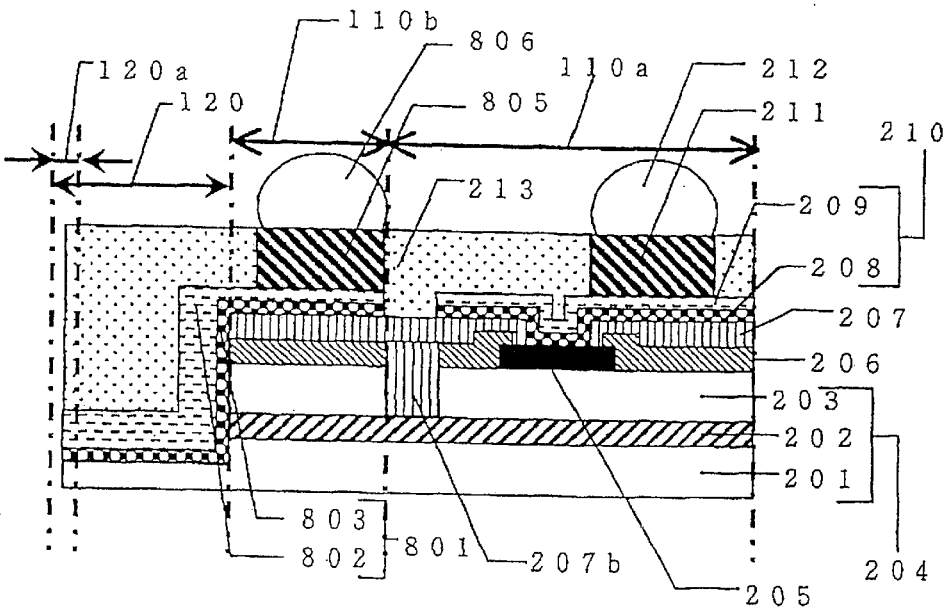

Incidentally, an insulating film 207b may be provided in the boundary between an element forming semiconductor substrate 203 in a first area 110a of an element forming area 110 and the element forming semiconductor substrate 203 in a second area 110b as shown in FIG. 9(b). Owing to its provision, the insulating film 207a in the edge area 120 can be cut or removed. Thus, the edge area 120 shown in FIG. 9(b) can be formed so as to be considerably narrower than the edge area 120 shown in FIG. 9(a).

Sixth Preferred Embodiment

FIG. 10 is a diagram related to a semiconductor device according to a sixth embodiment of the present invention. FIG. 10 shows a structure of the semiconductor device according to the sixth embodiment of the present invention. Incidentally, FIG. 10 shows partly cross-sectional views of an edge area 120 and a second area 110b in an element forming area 110 employed in the semiconductor device according to the sixth embodiment of the present invention.

In the semiconductor device according to the sixth embodiment of the present invention, a sealing member 213 in the edge area 120 is provided over the surface of a second conductive layer 801 and a first surface of a base semiconductor substrate 201 as shown in FIG. 10. Thus, the area at which the sealing member 213 and the second conductive layer 801 in the edge area 120 are brought into contact, becomes wide. Namely, the sealing member 213 and the base semiconductor substrate 201 are exposed and the second conductive layer 801 is not exposed at an edge portion of the semiconductor device according to the sixth embodiment of the present invention.

According to the semiconductor device showing the sixth embodiment of the present invention, the advantageous effects (1), (2) and (4), (10) and (11), and (12) respectively obtained in the semiconductor devices according to the first, third and fourth embodiments of the present invention are brought about.

Figure 10A:
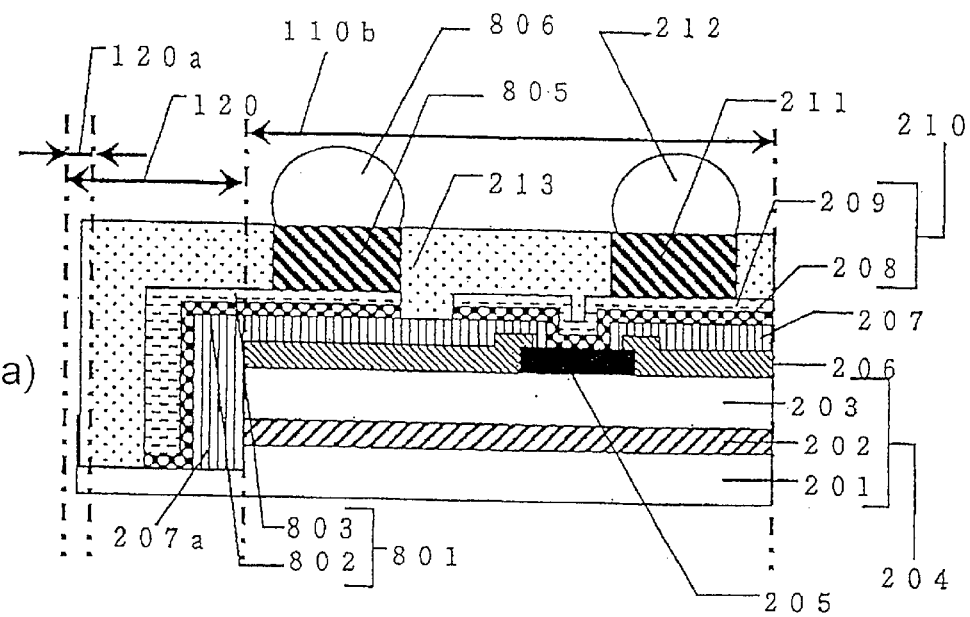
FIG. 10 is a partially sectional view illustrating a structure of a semiconductor device according to a sixth embodiment of the present invention.
Figure 10B:
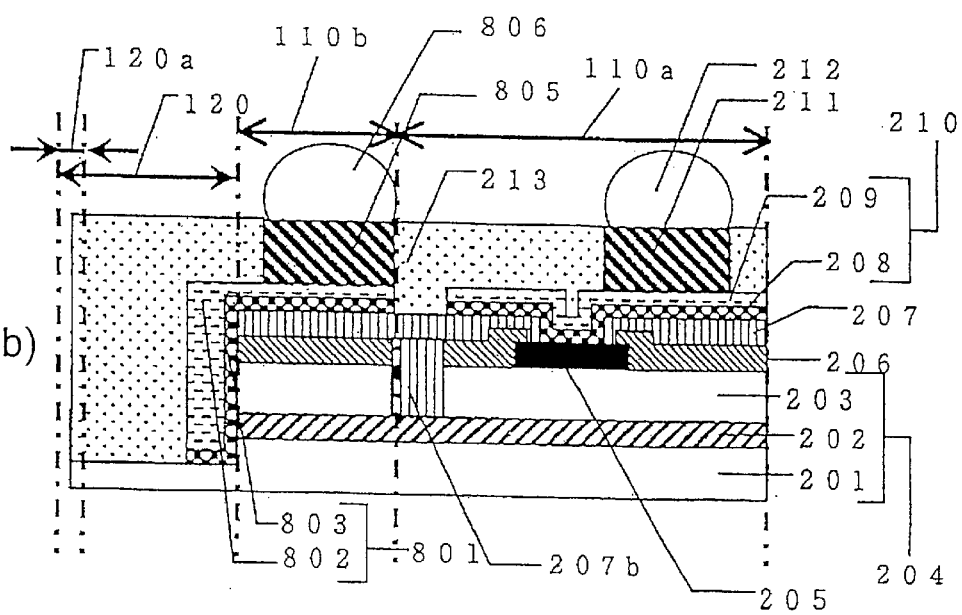

Incidentally, an insulating film 207b may be provided in the boundary between an element forming semiconductor substrate 203 in a first area 110a of an element forming area 110 and the element forming semiconductor substrate 203 in a second area 110b as shown in FIG. 10(b). Owing to its provision, the insulating film 207a in the edge area 120 can be cut or removed. Thus, the edge area 120 shown in FIG. 10(b) can be formed so as to be considerably narrower than the edge area 120 shown in FIG. 10(a).

Seventh Preferred Embodiment

Figure 11:
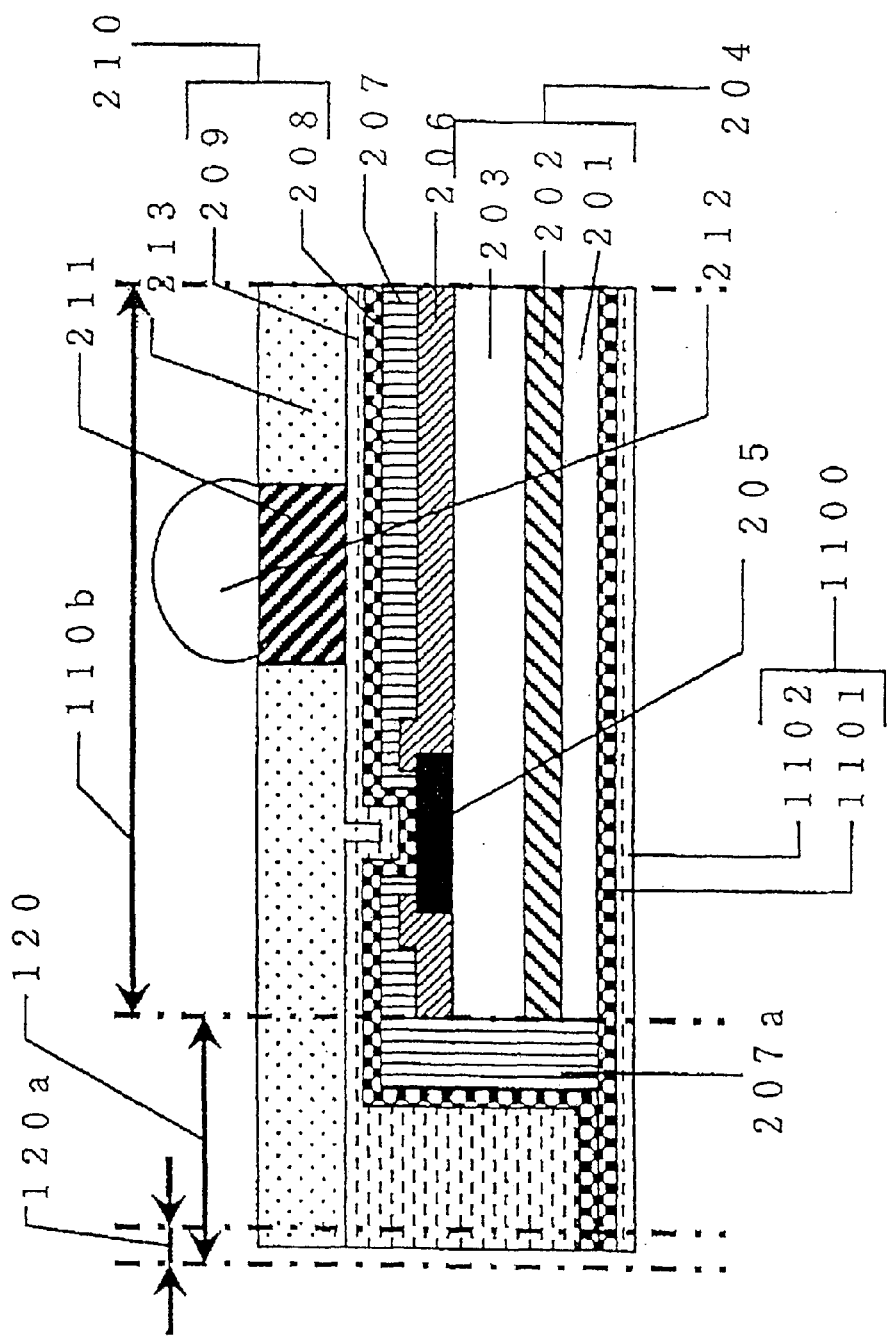
FIG. 11 is a partially sectional view depicting a structure of a semiconductor device according to a seventh embodiment of the present invention.

FIGS. 11 and 12 are respectively diagrams related to a semiconductor device according to a seventh embodiment of the present invention and a method of manufacturing the same. FIG. 11 shows a structure of the semiconductor device according to the seventh embodiment of the present invention, and FIG. 12 shows a process for manufacturing the semiconductor device according to the seventh embodiment of the present invention. Incidentally, the respective drawings are respectively partly cross-sectional views of an edge area 120 and a second area 110b of an element forming area 110 employed in the semiconductor device according to the seventh embodiment of the present invention.

The structure of the semiconductor device according to the seventh embodiment of the present invention will first be described. The semiconductor device according to the seventh embodiment of the present invention has a third retribute 1100 (hereinafter called a "third conductive layer 1100") as shown in FIG. 11. The third conductive layer 1100 comprises a metal film 1101 (hereinafter called a "third Ti metal film 1101") composed of Ti (titanium), for example, and a metal film 1102 (hereinafter called a "third Cu metal film 1102") composed of Cu (copper), for example.

The third Ti metal film 1101 is provided over a second surface (e.g., bottom face) of a base semiconductor substrate 201, a second surface (e.g., bottom face) of an insulating film 207a, and a second surface (e.g., bottom face) of a Ti metal film 208. Here, the third Ti metal film 1101 in the edge area 120 is electrically connected to a conductive layer 210. The third Cu metal film 1102 is provided over a second surface (e.g., bottom face) of the third Ti metal film 1101. The third Cu metal film 1102 is electrically connected to the third Ti metal film 1101.

According to the semiconductor device showing the seventh embodiment of the present invention, the following advantageous effects are brought about in addition to the advantageous effects (1) through (4) obtained in the semiconductor device according to the first embodiment of the present invention.

(13) The third conductive layer 1100 is provided over the second surface of the base semiconductor substrate 201, the second surface of the insulating film 207a, and the second surface of the Ti metal film 208. Thus, the semiconductor device according to the seventh embodiment of the present invention is capable of supplying a voltage supplied through a solder ball 212 to the entire base semiconductor substrate 201 via the third conductive layer 1100. Even when no voltage is supplied via the solder ball 212, the semiconductor device according to the seventh embodiment of the present invention is capable of supplying the voltage to the base semiconductor substrate 201 through the use of the third conductive layer 1100.

A method of manufacturing the semiconductor device according to the seventh embodiment of the present invention will next be explained with reference to FIG. 12. The drawing discloses that a process of FIG. 12 is carried out after the process step of FIG. 4(d). However, the method of manufacturing the semiconductor device according to the seventh embodiment of the present invention is also capable of executing the process shown in FIG. 12 between the process step of FIG. 4(c) and the process step of FIG. 4(d).

Figure 12A:
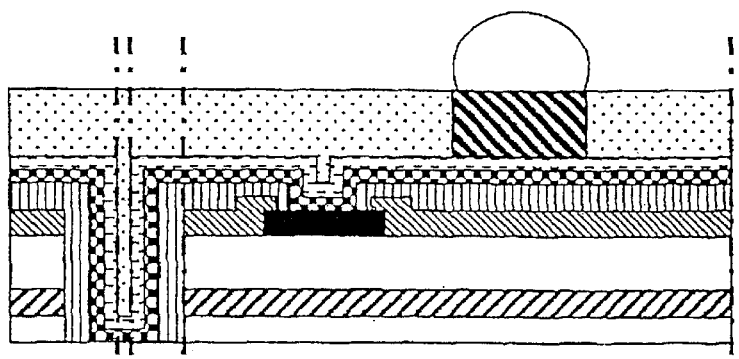
FIG. 12 is a partially sectional view for describing a process for manufacturing the semiconductor device according to the seventh embodiment of the present invention.

As shown in FIG. 12(a), a dicing blade is first used to cut the entire second surface of a base semiconductor substrate 201 until an insulating film 207a in an edge area 120 and a Ti metal film 208 in the edge area 120 are exposed.

Figure 12B:
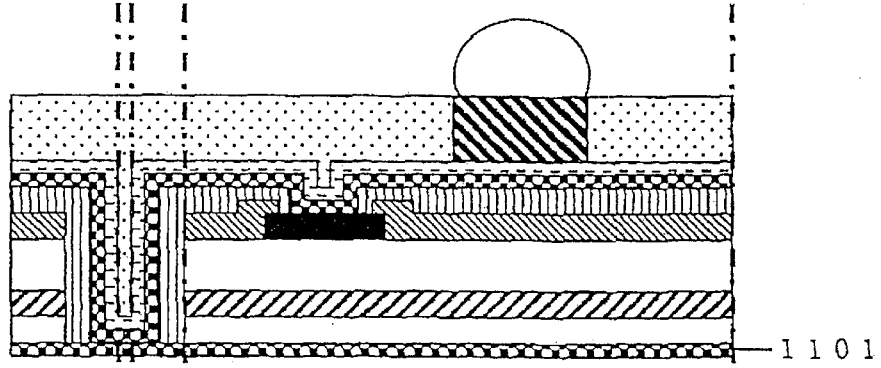

Next, as shown in FIG. 12(b), a third Ti metal film 1101 is provided over the cut second surface of the base semiconductor substrate 201 and the exposed insulating film 207a and Ti metal film 208 by a sputtering method.

Figure 12C:
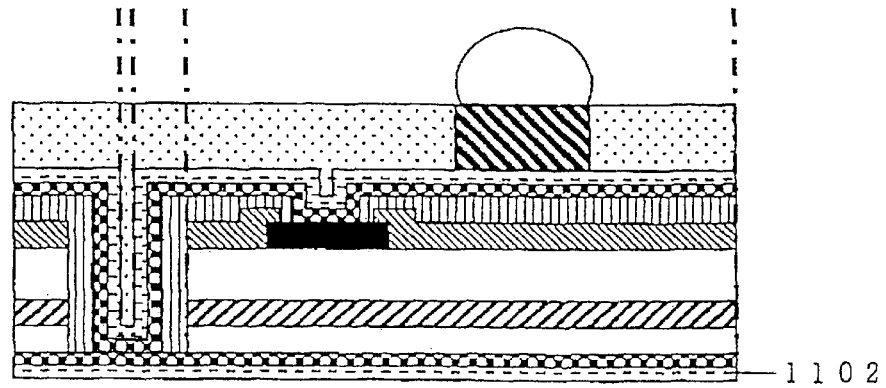

Next, as shown in FIG. 12(c), a third Cu metal film 1102 is provided over the back of the third Ti metal film 1101 by the sputtering method.

According to the method of manufacturing the semiconductor device showing the seventh embodiment of the present invention, the advantageous effects (5) and (6) obtained in the method of manufacturing the semiconductor device according to the first embodiment of the present invention are brought about.

Eighth Preferred Embodiment

Figure 13:
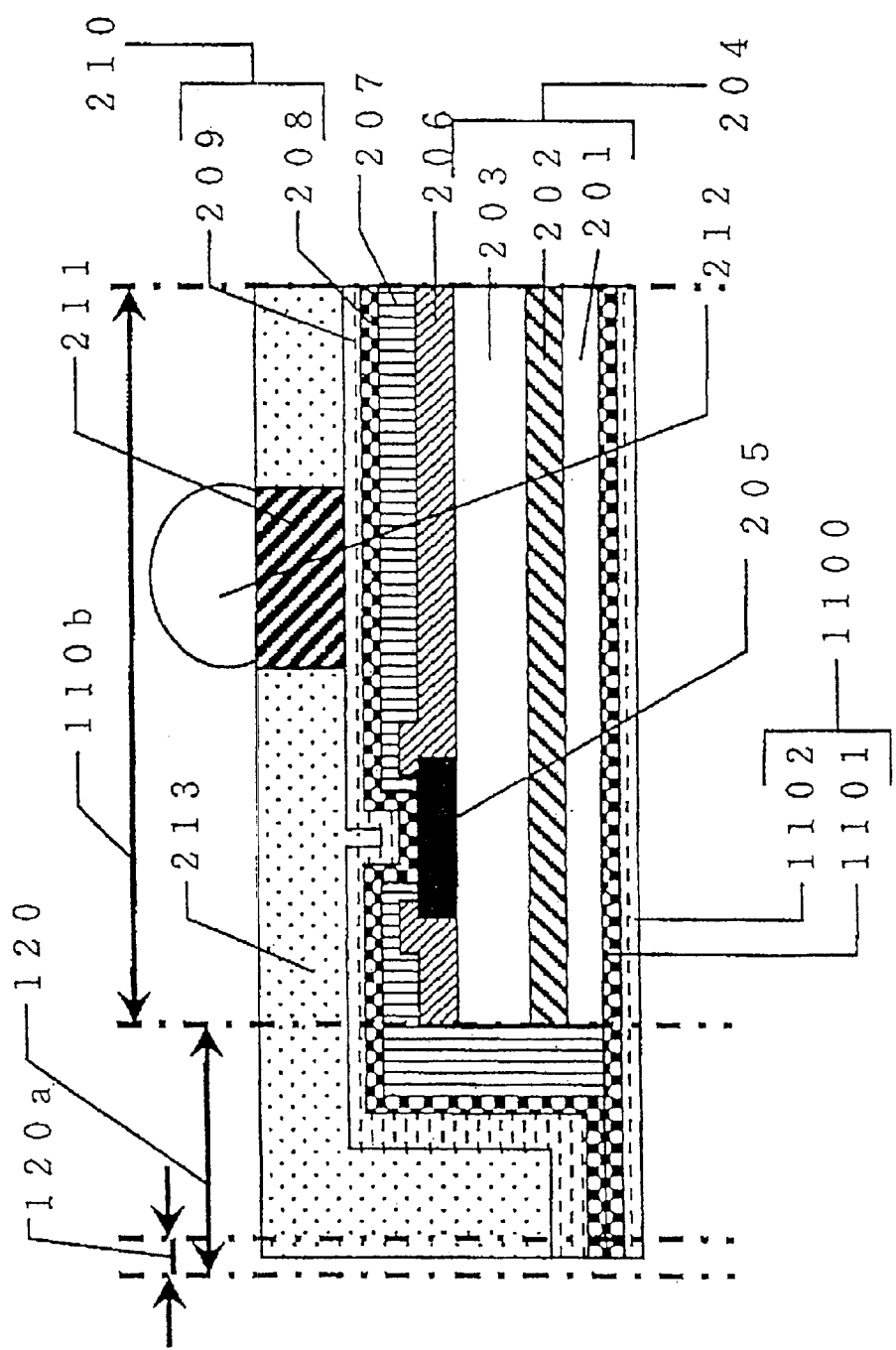
FIG. 13 is a partially sectional view depicting a structure of a semiconductor device according to an eighth embodiment of the present invention.

FIG. 13 is a diagram related to a semiconductor device according to an eighth embodiment of the present invention. FIG. 13 shows a structure of the semiconductor device according to the eighth embodiment of the present invention. Incidentally, FIG. 13 shows partly cross-sectional views of an edge area 120 and a second area 110b of an element forming area 110 employed in the semiconductor device according to the eighth embodiment of the present invention.

In the semiconductor device according to the eighth embodiment of the present invention, a third conductive layer 1100 is provided over the second surface of the base semiconductor substrate 201 employed in the semiconductor device according to the second embodiment of the present invention as shown in FIG. 13.

According to the semiconductor device showing the eighth embodiment of the present invention, the advantageous effects (1) through (4), (7) and (8), and (13) respectively obtained in the semiconductor devices according to the first, second and seventh embodiments of the present invention are brought about.

Ninth Preferred Embodiment

Figure 14:
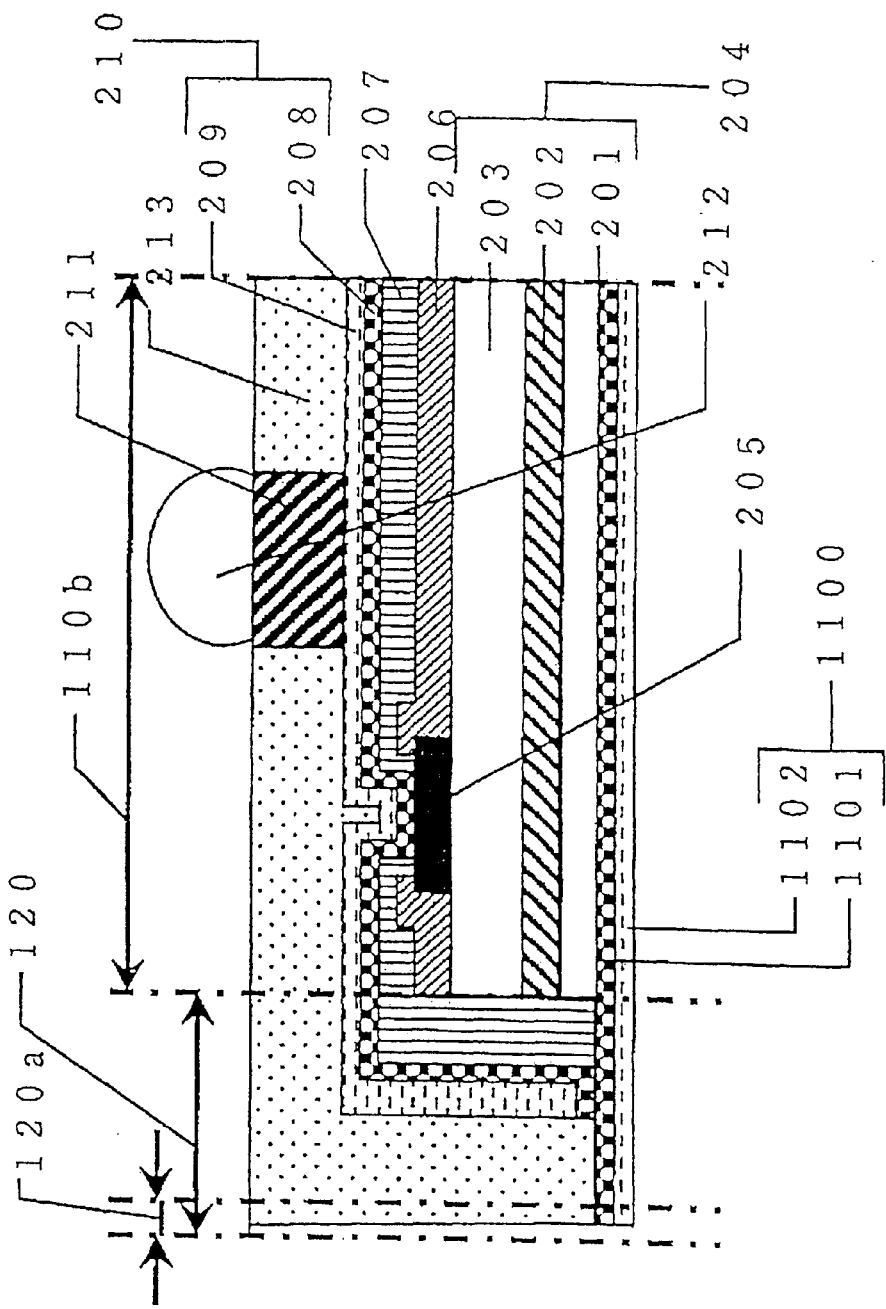
FIG. 14 is a partially sectional view showing a structure of a semiconductor device according to a ninth embodiment of the present invention.

FIG. 14 is a diagram related to a semiconductor device according to a ninth embodiment of the present invention. FIG. 14 shows a structure of the semiconductor device according to the ninth embodiment of the present invention. Incidentally, FIG. 14 shows partly cross-sectional views of an edge area 120 and a second area 110b of an element forming area 110 employed in the semiconductor device according to the ninth embodiment of the present invention.

In the semiconductor device according to the ninth embodiment of the present invention, a third conductive layer 1100 is provided over the second surface of the base semiconductor substrate 201 employed in the semiconductor device according to the third embodiment of the present invention as shown in FIG. 14.

According to the semiconductor device showing the ninth embodiment of the present invention, the advantageous effects (1) through (4), (10) and (11), and (13) respectively obtained in the semiconductor devices according to the first, third and seventh embodiments of the present invention are brought about.

Tenth Preferred Embodiment

Figure 15A:
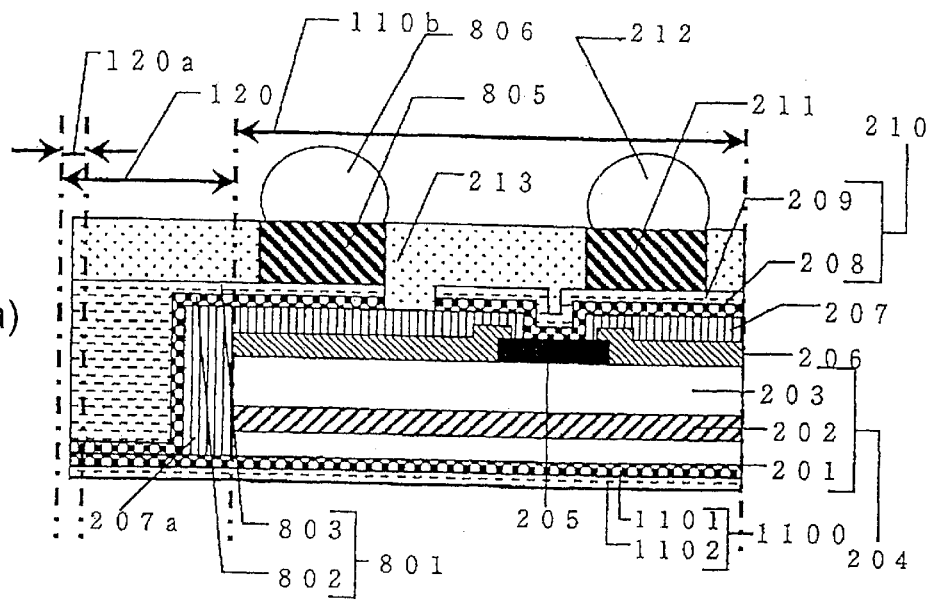
FIG. 15 is a partially sectional view illustrating a structure of a semiconductor device according to a tenth embodiment of the present invention.
Figure 15B:
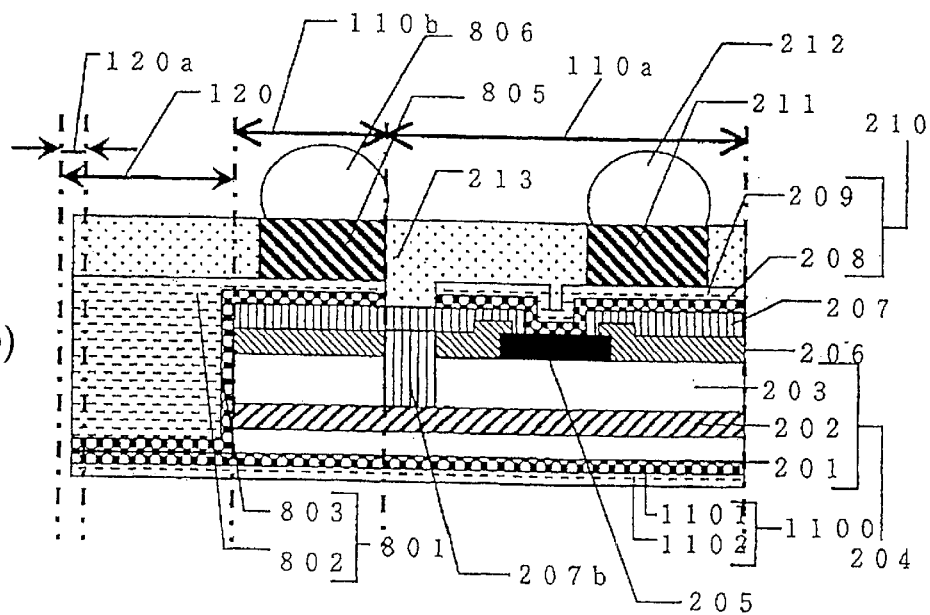

FIG. 15 is a diagram related to a semiconductor device according to a tenth embodiment of the present invention. FIG. 15 shows a structure of the semiconductor device according to the tenth embodiment of the present invention. Incidentally, FIG. 15 shows partly cross-sectional views of an edge area 120 and a second area 110b of an element forming area 110 employed in the semiconductor device according to the tenth embodiment of the present invention.

In the semiconductor device according to the tenth embodiment of the present invention, a third conductive layer 1100 is provided over the second surface of the base semiconductor substrate 201 employed in the semiconductor device according to the fourth embodiment of the present invention as shown in FIG. 15.

According to the semiconductor device showing the tenth embodiment of the present invention, the advantageous effects (1) and (2), (4), and (12) and (13) respectively obtained in the semiconductor devices according to the first, fourth and seventh embodiments of the present invention are brought about.

Eleventh Preferred Embodiment

Figure 16A:
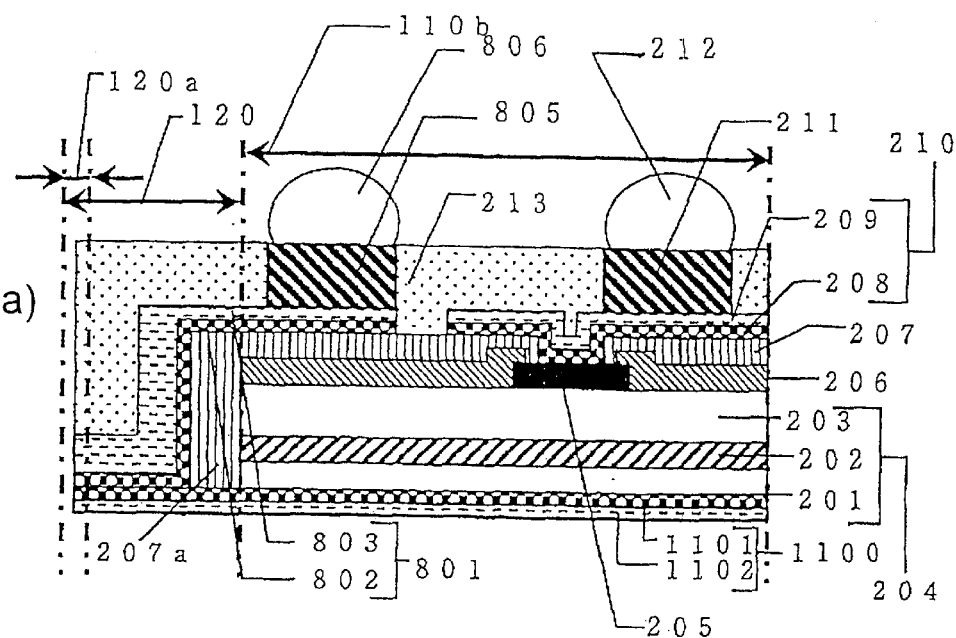
FIG. 16 is a partially sectional view depicting a structure of a semiconductor device according to an eleventh embodiment of the present invention.
Figure 16B:
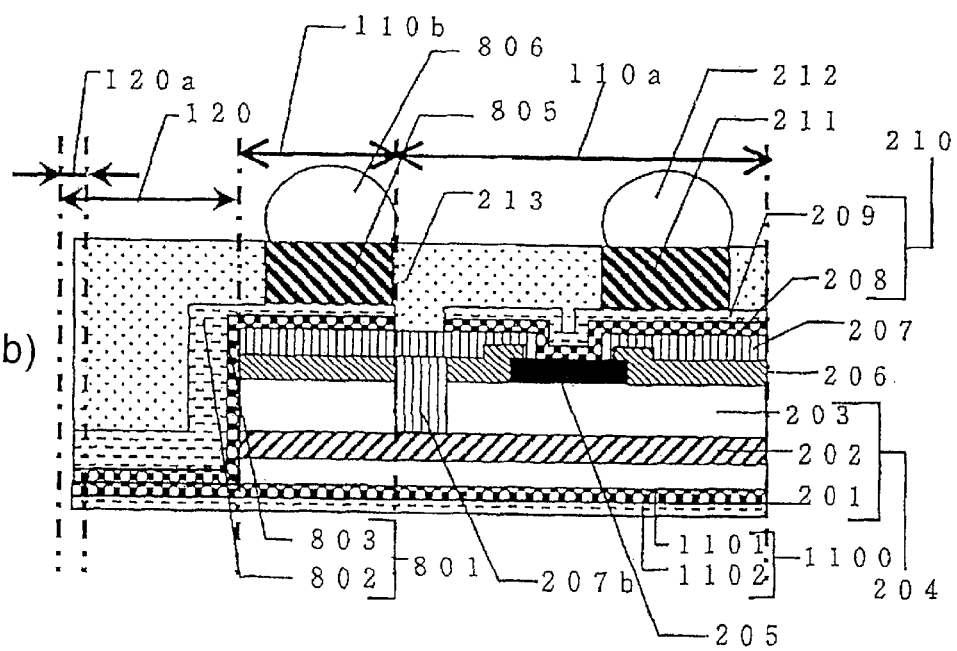

FIG. 16 is a diagram related to a semiconductor device according to an eleventh embodiment of the present invention. FIG. 16 shows a structure of the semiconductor device according to the eleventh embodiment of the present invention. Incidentally, FIG. 16 shows partly cross-sectional views of an edge area 120 and a second area 110b of an element forming area 110 employed in the semiconductor device according to the eleventh embodiment of the present invention.

In the semiconductor device according to the eleventh embodiment of the present invention, a third conductive layer 1100 is provided over the second surface of the base semiconductor substrate 201 employed in the semiconductor device according to the fifth embodiment of the present invention as shown in FIG. 16.

According to the semiconductor device showing the eleventh embodiment of the present invention, the advantageous effects (1) and (2), (4), (7) and (8), and (12) and (13) respectively obtained in the semiconductor devices according to the first, second, fourth and seventh embodiments of the present invention are brought about.

Twelfth Preferred Embodiment

Figure 17A:
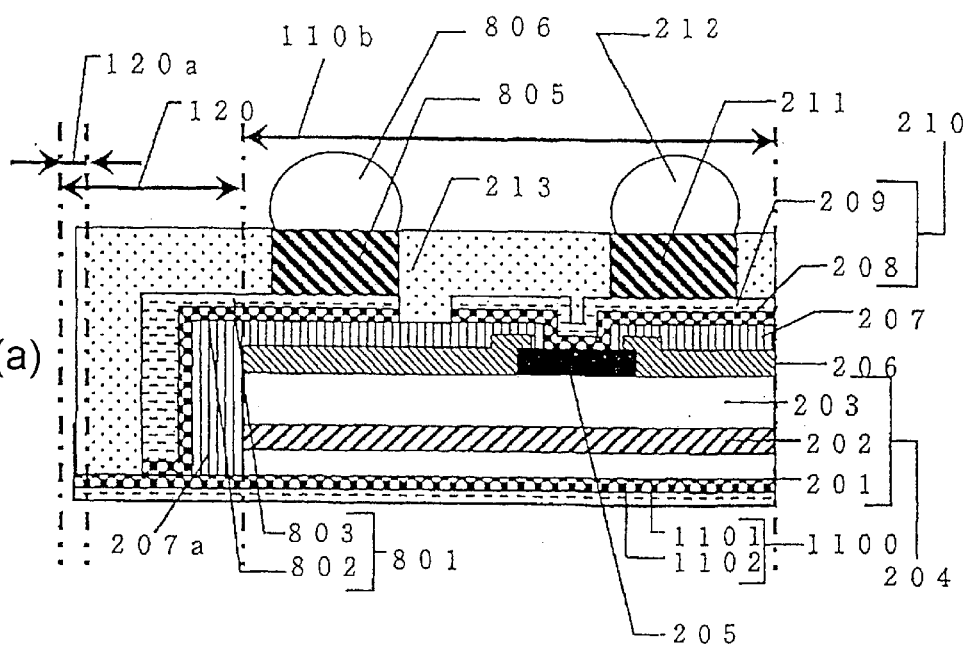
FIG. 17 is a partially sectional view showing a structure of a semiconductor device according to a twelfth embodiment of the present invention.
Figure 17B:
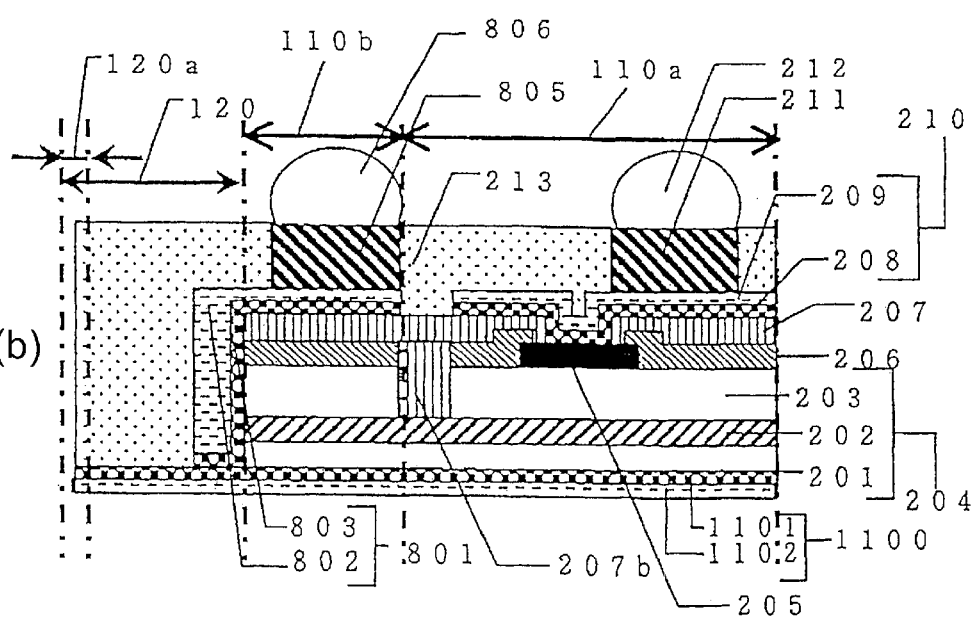
Figure 18:
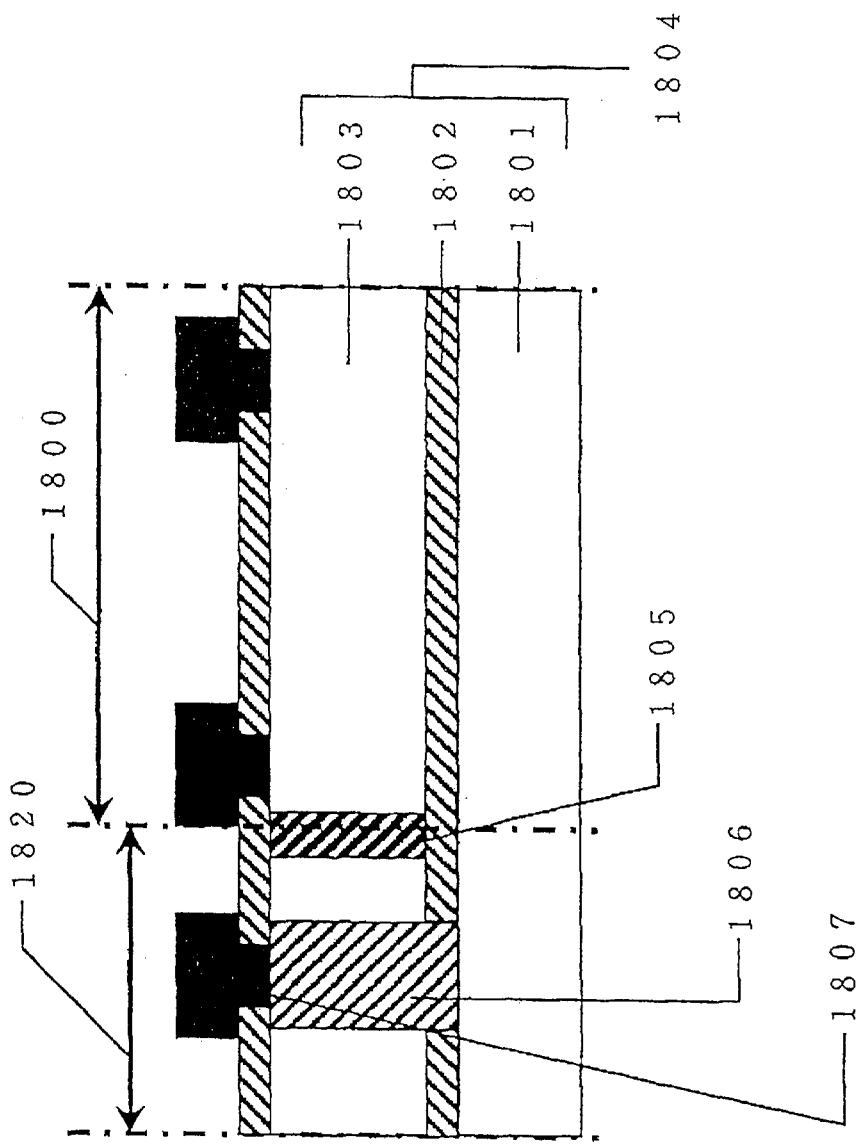
FIG. 18 is a cross-sectional view illustrating a structure of a conventional semiconductor device.

FIG. 17 is a diagram related to a semiconductor device according to a twelfth embodiment of the present invention. FIG. 17 shows a structure of the semiconductor device according to the twelfth embodiment of the present invention. Incidentally, FIG. 17 shows partly cross-sectional views of an edge area 120 and a second area 110b of an element forming area 110 employed in the semiconductor device according to the twelfth embodiment of the present invention.

In the semiconductor device according to the twelfth embodiment of the present invention, a third conductive layer 1100 is provided over the second surface of the base semiconductor substrate 201 employed in the semiconductor device according to the sixth embodiment of the present invention as shown in FIG. 17.

According to the semiconductor device showing the twelfth embodiment of the present invention, the advantageous effects (1), (2) and (4), (10) and (11), (12), and (13) respectively obtained in the semiconductor devices according to the first, third, fourth and seventh embodiments of the present invention are brought about.

While the invention made by the present inventors has been described above specifically by the embodiments, the present invention is not limited to the aforementioned embodiments. It is needless to say that various changes can be made thereto within the scope not departing from the substance thereof.

An advantageous effect obtained by a typical one of the inventions disclosed in the present application will be explained in brief as follows:

The present invention is capable of narrowly forming an edge area in which a conductive layer for fixing a potential applied to the back of a semiconductor device is provided. Thus, the present invention can provide a semiconductor device brought into lesser size than a conventional semiconductor device.

What is claimed is:

1. A semiconductor device comprising:
    a base semiconductor substrate having an element forming area and an edge area which surrounds the element forming area;
    a buried oxide film provided over a first surface of said base semiconductor substrate in the element forming area;
    an element forming semiconductor substrate provided over a first surface of said buried oxide film;
    an insulating film provided over the element forming semiconductor substrate, a second surface of said buried oxide film, and the first surface of said base semiconductor substrate in the edge area;
    a conductive layer provided over said insulating film, and the first surface of said base semiconductor substrate in the edge area;
    a conductive columnar member provided so as to be electrically connected to said conductive layer; and
    a sealing member for sealing side surfaces of said conductive columnar member, and said conductive layer.

2. The semiconductor device according to claim 1, wherein a second conductive layer is provided over a second surface of said base semiconductor substrate.

3. A semiconductor device comprising:
    a base semiconductor substrate having an element forming area and an edge area which surrounds the element forming area;
    a buried oxide film provided over a first surface of said base semiconductor substrate in the element forming area;
    an element forming semiconductor substrate provided over a first surface of said buried oxide film;
    an electrode pad provided over said element forming semiconductor substrate;
    an oxide film provided over part of said electrode pad, and said element forming semiconductor substrate;
    an insulating film provided over part of said electrode pad, said oxide film, a second surface of said element forming semiconductor substrate, a second surface of said buried oxide film, and the first surface of said base semiconductor substrate in the edge area;
    a conductive layer provided over said electrode pad, said insulating film, and the first surface of said base semiconductor substrate in the edge area;
    a conductive columnar member provided so as to be electrically connected to said conductive layer in the element forming area;
    a spherical electrode provided over a first surface of said conductive columnar member; and
    a sealing member for sealing a second surface of said conductive columnar member and said conductive layer.

4. The semiconductor device according to claim 3, wherein said conductive layer is provided over part of the first surface of said base semiconductor substrate in the edge area, and
    said sealing member seals the first surface of said base semiconductor substrate in the edge area.

5. The semiconductor device according to claim 3 or 4, wherein a second conductive layer is provided over a second surface of said base semiconductor substrate.

6. A semiconductor device comprising:
    a base semiconductor substrate having an element forming area and an edge area which surrounds the element forming area;

a buried oxide film provided over a first surface of said base semiconductor substrate in the element forming area;

an element forming semiconductor substrate provided over a first surface of said buried oxide film;

an electrode pad provided over said element forming semiconductor substrate;

an oxide film provided over part of said electrode pad, and said element forming semiconductor substrate;

an insulating film provided over part of said electrode pad, said oxide film, said element forming semiconductor substrate, a second surface of said buried oxide film, and the first surface of said base semiconductor substrate in the edge area;

a first conductive layer provided over said electrode pad and said insulating film;

a second conductive layer provided over said insulating film, said element forming semiconductor substrate, the second surface of said buried oxide film, and the first surface of said base semiconductor substrate, and electrically disconnected from said first conductive layer;

a first conductive columnar member provided so as to be electrically connected to said first conductive layer;

a second conductive columnar member provided so as to be electrically connected to said second conductive layer;

a first spherical electrode provided over a first surface of said first conductive columnar member;

a second spherical electrode provided over a first surface of said second conductive columnar member; and a sealing member for sealing second surfaces of said first and second conductive columnar members and said first and second conductive layers.

7. The semiconductor device according to claim 6, wherein said second conductive layer is provided over part of the first surface of said base semiconductor substrate in the edge area, and said sealing member seals the first surface of said base semiconductor substrate in the edge area.

8. The semiconductor device according to claim 6 or 7, wherein a third conductive layer is provided over a second surface of said base semiconductor substrate.

9. The semiconductor device according to claim 6, wherein said element forming area is divided into a first area having said electrode pad, and a second area adjacent to said edge area, and said first and second areas adjoin each other through a second insulating film extending from said insulating film to said buried oxide film.

10. The semiconductor device according to claim 9, wherein said second conductive layer is provided over part of the first surface of said base semiconductor substrate in the edge area, and said sealing member seals the first surface of said base semiconductor substrate in the edge area.

11. The semiconductor device according to claim 9 or 10, wherein a third conductive layer is provided over a second surface of said base semiconductor substrate.

12. The semiconductor device according to claim 2, wherein the first and second surfaces of said base semiconductor substrate are opposite main surfaces of said base semiconductor substrate.

13. The semiconductor device according to claim 1, wherein said conductive columnar member is provided in the element forming area.

14. The semiconductor device according to claim 5, wherein the first and second surfaces of said base semiconductor substrate are opposite main surfaces of said base semiconductor substrate.

15. The semiconductor device according to claim 6, wherein said second conductive columnar member is provided in the element forming area.

16. The semiconductor device according to claim 8, wherein the first and second surfaces of said base semiconductor substrate are opposite main surfaces of said base semiconductor substrate.

* * * * *